United States Patent [19]

Pryor et al.

[11] Patent Number: 4,809,044
[45] Date of Patent: Feb. 28, 1989

[54] THIN FILM OVERVOLTAGE PROTECTION DEVICES

[75] Inventors: Roger W. Pryor, Bloomfield Hills; Napoleon P. Formigoni, Birmingham; Stanford R. Ovshinsky, Bloomfield Hills, all of Mich.

[73] Assignee: Energy Conversion Devices, Inc., Troy, Mich.

[21] Appl. No.: 936,553

[22] Filed: Nov. 26, 1986

Related U.S. Application Data

[63] Continuation-in-part of Ser. No. 899,446, Aug. 22, 1986, abandoned.

[51] Int. Cl.$^4$ .................. H01L 45/00; H01L 29/44; H01L 29/46; H01L 29/86
[52] U.S. Cl. .......................... 357/2; 357/67; 357/68; 357/71; 357/56; 357/80; 357/81
[58] Field of Search .................. 357/2, 68, 81, 80, 71, 357/67, 56

[56] References Cited

U.S. PATENT DOCUMENTS 4,433,342  2/1984  Patel et al. ..................... 357/2

OTHER PUBLICATIONS

Pearson et al. "Filamentary Conduction in Semiconductor Glass Diodes", *Appl. Phys. Lett.* vol. 14, No. 9, May 1969, pp. 280–282.

Primary Examiner—Andrew J. James
Assistant Examiner—John Lamont
Attorney, Agent, or Firm—Marvin S. Siskind; Richard M. Goldman

[57] ABSTRACT

Solid-state overvoltage protection devices, preferably formed of deposited thin film, chalcogenide, threshold switching materials, typically include at least one elongated current conduction path through an elongated cross-sectional area of the threshold switching material. The cross-sectional area is formed with a length far exceeding the effective width thereof for distributing the transient current produced by overvoltage conditions over a relatively large area. In this manner, the concentration of localized heating effects can be avoided.

26 Claims, 5 Drawing Sheets

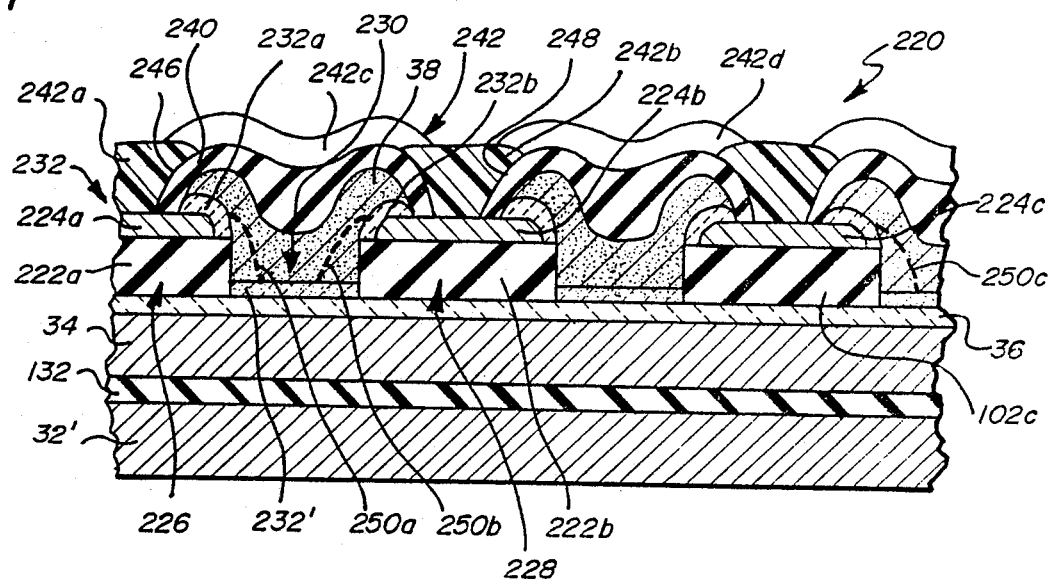
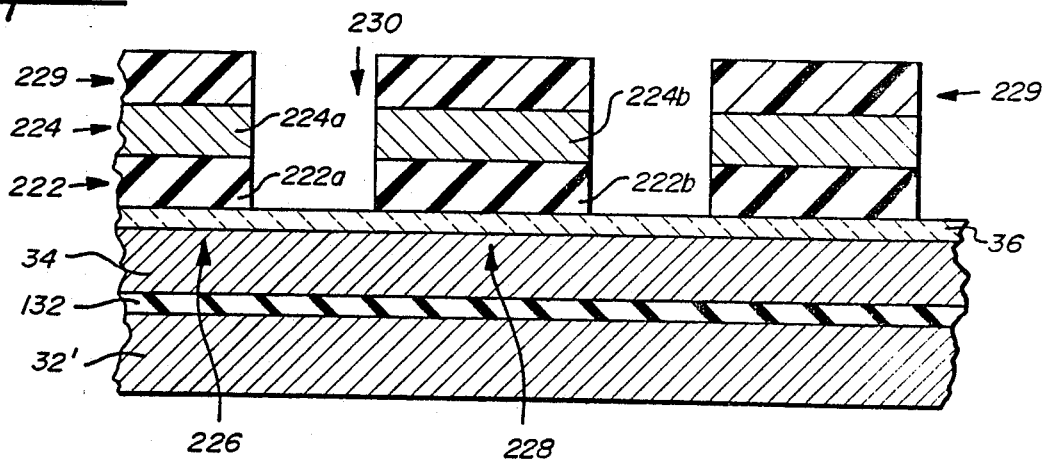
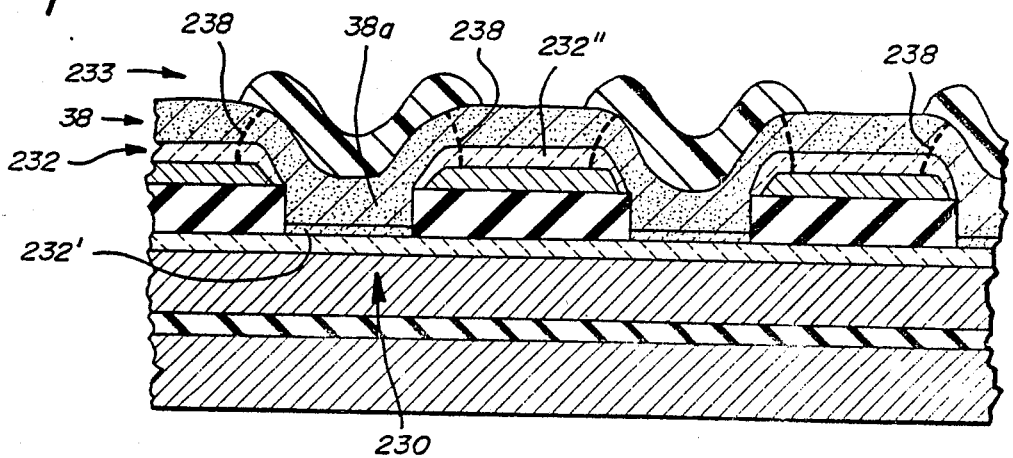

THIN FILM OVERVOLTAGE PROTECTION DEVICES

CROSS-REFERENCE TO RELATED APPLICATION

This is a continuation-in-part of U.S. patent application Ser. No. 899,446 filed Aug. 22, 1986 now abandoned.

FIELD OF THE INVENTION

This invention relates in general to solid-state overvoltage protection devices, and in particular to thin film semiconductor devices and structures utilizing substantially amorphous threshold switching material for suppression of high speed transients.

BACKGROUND OF THE INVENTION

The need to protect electronic circuitry from overvoltages, especially transient overvoltage conditions, is well known. Most electronic components are only built to withstand the application of certain limited voltages across them, and will be damaged or at least seriously malfunction if far higher voltages are applied.

There are many sources of transient overvoltages, such as lightning, electrostatic discharge (ESD), electromagnetic induction (EMI). Failure of circuit components may also allow excess voltages to be applied across other circuit components. Inductive surges are yet another source of overvoltage transients.

Lightning, ESD and inductive surges are all capable of producing very rapid high voltage transients. An inductive surge produced by interrupting a running 115 volt motor can be as high as 1,000 volts or more, for example. Electrostatic discharges, such as those produced by a person walking on a wool rug on a dry winter day, can easily result in a charge of tens of thousands of volts. Although such electrostatic discharges usually involve a relatively minor flow of current, they, like inductive surges, are sufficient to destroy many types of microelectronic circuits. Overvoltage transients caused by lightning can deliver by direct strikes large amounts of currents at tens of thousands to hundreds of thousands of volts. By EMI, lightning can generate high voltage transients in the megahertz frequency range and higher ranges.

Conventional means for dealing with relatively small overvoltages include shunting capacitors, breakdown diodes, varistors and inductive coils. Breakdown diodes such as zener diodes when reverse biased beyond a certain threshold voltage conduct large currents. Like virtually all overvoltage protection devices, such a diode is placed ahead or "upstream" of or in parallel with a circuit element to be protected, and shunts excess voltage applied thereacross to a discharge path such as a neutral line, D.C. common line, chassis or ground. However, such diodes are capable of only handling limited overvoltages without becoming permanently damaged themselves.

Varistors, which are typically made of pressed powders, act somewhat like zener diodes, in that they offer a high impedance at low voltages and a relatively low impedance at high voltages. However, they are distinguished from zener diodes in that their current characteristics are symmetrical rather than asymmetrical, and thus can offer protection against overvoltage in both directions.

Inductive coils or chokes, while unable to protect circuitry from low frequency or static overvoltages, do tend to filter out rapid voltage transients by presenting a large impedance. Since they also present high impedance to high frequency signals, they are inappropriate for protecting high frequency circuitry from high frequency overvoltages. Such chokes are also normally relatively bulky and expensive.

Spark gaps are another form of overvoltage protection associated with higher power devices, and recently miniaturized forms of them have been developed for use on P.C. boards and the like. Spark gaps contain two opposing electrodes separated by a gas, such as air, which has a desired breakdown, or sparking voltage. When an overvoltage is applied across the spark gap, its nonconductive gas becomes ionized, forming a relatively low resistance path between its electrodes. Although spark gaps have beneficial uses, they usually are not very appropriate for use in solid-state circuitry because they are not solid-state devices and because they are usually fairly large, even in miniaturized form. Also the time required for the operation of spark gaps is usually too slow to provide full protection from extremely rapid transients.

Varistors, inductive coils and spark gaps all share the same shortcoming--they cannot be readily incorporated into microelectronic devices due to the required way in which they must be made.

Several types of integrated circuits, CMOS for example, are notoriously sensitive to static electricity, particularly before being inserted into a larger circuit on a P.C. board. Furthermore, the CMOS circuits themselves are typically unable to handle any significant power, so that it is difficult and expensive to arrange on-chip protection by exclusively dedicating certain portions of the chip to such a protection function. Thus, there is a definite need for extremely high speed and/or high power protection that can be readily incorporated directly into all types of microelectronic circuitry, as an integral part thereof, to protect such circuitry at all times.

As a result of the nuclear age a new and very threatening source of overvoltage transients is made possible by the phenomenon known as the nuclear electromagnetic pulse or "EMP". EMP will be produced by the Compton electrons scattered by gamma rays from a nuclear explosion colliding with air molecules of the upper atmosphere. Theoretical studies have indicated that if a nuclear device were exploded at a high altitude above most of the earth's atmosphere a large EMP generated therefrom would have sufficient intensity to induce a large current in conductors hundreds or thousands of miles away to destroy electronic equipment connected to or containing such conductors.

EMP is particularly difficult to protect against for three reasons: (1) the extremely rapid rise time; (2) the expected intensity, and (3) the ubiquitous presence, i.e., all conductors of any appreciable length not enclosed with a suitable Faraday shield will act as an antenna, and thus be subject to severe electrical transients due to the EMP. It has been estimated that EMP will produce an extremely high overvoltage within approximately one nanosecond or less and reach a peak field in only about 10 nanoseconds, before trailing off in about one microsecond. The peak field produced by a one-megaton warhead exploding in the upper atmosphere may be as high as 50,000 volts/meter. Further details about the nature of EMP and the inadequacies of conventional overvoltage protection devices to protect against them is found in "Electromagnetic pulses: potential crippler," *IEEE Spectrum*, May, 1981, pp. 41–46.

Most conventional solid-state overvoltage protection devices are too slow or limited in their power handling capabilities to provide full protection against the effects of very close lightning strikes or EMP. This is because such lightning strikes and EMP can produce overvoltages two or three orders of magnitude or more above the normal operating voltages of the integrated circuits subjected to such transients, thus leading to enormous current surges capable of destroying virtually almost all types of solid-state semiconductor protection devices. As the energy content of such pulses is increased, the problem becomes more severe, and requires extremely rugged, high ampacity overvoltage protection devices, preferably incorporated at the integrated circuit level, to handle any transients which reach such microelectronic circuits. As the size of microelectronic circuit elements is reduced, the problem also becomes more severe since less energy is required to damage smaller devices. To avoid creating problems, overvoltage protection devices, when inserted into or included as part of the electronic circuit to be protected, must not impose undue insertion losses in the circuit, or decrease switching speeds or band width y adding significant amounts of capacitance.

One class of overvoltage protection devices which has long held great potential for very high speed transient suppression applications are Ovonic threshold switching devices of the type first invented and announced by S. R. Ovshinsky in the 1960's. U.S. Pat. Nos. 3,171,591 (1966) and 3,343,034 to S. R. Ovshinsky (1967) specifically teach that this type of threshold switching device is suitable for use as surge suppressors, such as for transient inductive pulses and the like. Such switches have been known since at least 1968 to have a switching speed of less than 150 picoseconds, see, e.g., S. R. Ovshinsky, "Reversible Electrical Switching Phenomena in Disordered Structures", *Physical Review Letters*, Vol. 21, No. 20, Nov. 11, 1968, p. 1450(c).

R. Callarotti, et al., "Transmission Line Protection With Thin Film Chalcogenide Glass Devices," *Thin Solid Films*, Vol. 90, pp. 379–384 (1982), suggest that an Ovonic threshold switch of a thin film of chalcogenide glass is well suited for protecting a transmission line from EMP. A detailed mathematical analysis is presented therein in support of this view.

In U.S. patent application Ser. No. 666,582 filed Oct. 30, 1984 by G. Cheroff et al., which is assigned to the assignee of the present invention, a number of overvoltage protection devices using Ovonic threshold switching materials are proposed. These devices include various electrical connectors with Ovonic threshold switches providing a path for shunting transients to the connector casings, and integrated circuits and printed circuit boards having a thin film of Ovonic threshold material overlying the top wiring layer for providing protection for all conductors forming part of the top wiring layer. These devices are intended for use in protecting against EMP, ESD and other high voltage transients.

Ovonic threshold switching devices may be generally described for the purposes used herein as a switching device which has a bistable characteristic, including a threshold voltage and a minimum holding current. Specifically, the device includes a semiconductor material and at least a pair of electrodes in contact therewith, wherein the semiconductor material has a threshold voltage value and a high electrical resistance to provide a blocking condition for substantially blocking current therethrough, and wherein the high electrical resistance in response to a voltage above the threshold voltage value very rapidly decreases in at least one path between the electrodes to a low electrical resistance which is orders of magnitude lower than the high electrical reistance, which provides a conducting condition or path for conducting current through the semiconductor material. The conducting condition or path is maintained in the device so long as at least a minimum holding current continues to pass through the conducting path within the device. When the current falls below this minimum current value, the device rapidly reverts to its high resistance blocking condition. The voltage drop across the semiconductor material in a threshold switch when in its conducting condition is a fraction of the voltage drop across the material when in its high electrical resistance blocking condition, as measured near the threshold voltage value of the switch.

Many different combinations of atomic elements when combined in the proper proportions and manner have been shown to produce a semiconductor material having the aforementioned threshold switching action. Most commonly, chalcogenide glasses, such as $Te_{39}As_{36}Si_{17}Ge_7P_1$, are used. Examples of such materials and threshold switching devices made therewith are found in the following list of U.S. patents, all of which are assigned to the assignee of the present invention, and all of which are hereby incorporated by reference:

| | |
|---|---|
| 3,271,591 | 3,571,671 |
| 3,343,034 | 3,571,672 |
| 3,571,669 | 3,588,638 |
| 3,571,670 | 3,611,063 |

Threshold switches are generally two terminal devices, and have been shown in a number of configurations, including one having a pair of electrodes arranged in the form of interleaving metallic fingers or combs (see FIG. 7 of U.S. Pat. No. 3,271,591 to S. R. Ovshinsky). Since they exhibit symmetrical current-voltage (I-V) characteristics, have been applied typically in alternating current applications. They are ambipolar devices, that is the current in the conduction path therein consists of both holes and electrons. They can have extremely high current densities. If driven properly, threshold switches can have extremely fast switching speeds, such as into the nanosecond region and below, and make excellent surge suppression devices. Typically, a threshold switch is constructed of a thin film of preferably amorphous semiconductor material, and may be described as a semiconducting glass, although there are a number of other forms of threshold switches such as those described in U.S. Pat. No. 3,715,634 to S. R. Ovshinsky. Two terminal threshold devices, once turned on, cannot be turned off, except by reducing the current through the device below its minimum holding current for the requisite period of time, which is typically well under one microsecond.

The aforementioned patents and patent application, while disclosing a number of useful structures and configurations for Ovonic threshold switching devices in a variety of applications, do not disclose how to optimize the design of such devices for high power, extremely high speed applications. In particular, the foregoing references do not specifically teach any method for avoiding localized concentrations of currents in the threshold switching material which have been known to be of such intensity as to ablate the material or electrodes in contact therewith. The patents also do not teach how to scale up the size of integrated threshold switching devices so that the devices may reliably be used to handle transient currents in excess of several hundred milliamps, such as 5 amps, 10 amps or above.

Accordingly, the objects of the present invention are to provide an overvoltage protection device or apparatus which has at least several of the following attributes: (1) is capable of being scaled up to handle relatively large currents; (2) is of a highly efficient thermal design to allow for dissipation of heat due to the shunting of current produced by extremely large overvoltages; (3) produces minimum insertion losses when in use, and has minimal capacitance; (4) has multiple current paths for shunting current through a threshold switching material, including redundant interconnections to such current paths for increased reliability; (5) is capable of extremely high speed operation; and (6) presents minimum inductance when in use to facilitate such high speed operation.

Another important object of the present invention is to provide and overvoltage device structure which is capable of confining a filamentary current into one or more selected elongated current conduction channels, as a means of obtaining a structure well suited for handling large transient currents and dissipating any heat generated thereby.

SUMMARY OF THE INVENTION

In light of the foregoing objects, one aspect of the present invention provides a solid-state overvoltage protection apparatus of the type having a plurality of spaced electrodes and a body of threshold switching material disposed therebetween, said body having a high electrical resistance to provide a blocking condition for substantially blocking current therethrough at operating voltages below a first nominal level and a lower electrical resistance at overvoltages above the first nominal voltage level to provide a conducting condition for conducting current therethrough. The improvement in this apparatus comprises in combination: means for providing an elongated current conduction path of substantially uniform distance between said electrodes through the body confined to an elongated cross-sectional area of the body transverse to the direction of current flow, said cross-sectional area having an effective length along the major dimension of the area which is at least about ten times greater than the maximum effected width of the area, whereby relatively large currents associated with overvoltages which may flow therethrough are distributable over said elongated area.

The plurality of electrodes in the above-described apparatus may each have an elongated surface portion adjacent to and in intimate electrical contact with the body of threshold switching material, wherein one of the elongated surface portions is physically spaced equidistantly along its length from and operatively associated with another of said elongated surface portions, thereby providing said elongated current conduction path of substantially uniform distance between said two associated elongated surface portions. The apparatus may also include a highly thermally conductive substrate disposed below said threshold switching material. The substrate may be formed from an electrically conductive metal covered with an insulating layer, or may be formed from an insulating material.

The overvoltage protection devices of the present invention may have vertical, horizontal or diagonal current conduction paths through the body of threshold switching material. At least one of the electrodes and the threshold switching material may be patterned to form a mesa structure. Alternatively the overvoltage protection devices or apparatus of the present invention may include a layer of insulating material having an elongated opening therein in which at least a portion of said threshold switching material extends, and wherein one of said electrodes is disposed substantially in said opening, and another of said electrodes is disposed above said portion of said threshold switching material in said opening, such that when the current conduction path is formed in the apparatus it extends vertically between the electrode portion through said portion of threshold switching material disposed in said opening.

The apparatus of the present invention may also have at least one of the electrodes formed from a thin film layer of conductive material patterned to have a plurality of electrically interconnected sections spaced apart from one another at predetermined angles. For example, such patterned electrode-forming layers may include at least three leg sections interconnected at a common central node section which each extend outwardly therefrom in a direction different from the other two leg sections. The patterned layer may further include a plurality of common node sections interconnected by at least one of said leg sections.

In the various devices of the present invention, at least a portion of said body of threshold switching material preferably has the property that it changes from a high resistance state to a low resistance state when the voltage applied across it exceeds a given threshold voltage and maintains that low resistance state as long as a certain minimum maintanence voltage substantially less than the threshold voltage is maintained across it. This characteristic of Ovonic threshold switching material makes it ideally suited for handling high power transients, since it minimizes the generation of heat within an overvoltage protection device, and also acts to clamp the overvoltage to very low levels.

Other aspects, objects, features and advantages of the present invention will become apparent from the subsequent description and the appended claims taken in conjunction with the accompanying drawings.

BRIEF DESCRIPTION OF THE DRAWINGS

FIG. 9 is a partial side view of an electrical device of the present invention having a diagonal current conduction path.

FIGS. 10 and 11 are side views of the FIG. 9 device at different stages of partial construction.

DETAILED DESCRIPTION OF THE PREFERRED EMBODIMENTS

FIGS. 1 through 12 are cross-sectional side views of the several electrical devices of the present invention all of which can be configured as overvoltage protection devices to suppress high speed transients. Most of these devices are particularly well suited for forming high power overvoltage protection devices due to their highly efficient thermal design which makes it possible to control and quickly dissipate any heat which may be developed from handling high transient or even moderate continuous overvoltages. FIGS. 13 through 16 show various possible plan views of the electrical devices of the present invention, virtually all of which provide for efficient distribution of any heat generated in the device to highly thermal conductive substrates and/or electrodes where it can be harmlessly dissipated.

The preferred embodiments of the devices of the present invention shown in FIGS. 1 through 12 are current-carrying solid-state semiconductor devices having a plurality of metallic electrode layers, a plurality of thin film layers of carbon material associated with the electrodes, and a body or layer of semiconductor material in intimate electrical contact with the thin films of carbon material. Each of the electrodes are in intimate electrical contact with its respective thin film of carbon material such that current flows into one electrode through its layer of carbon material through the semiconductor material into the second layer of carbon material and from there into the second electrode. (Although not preferred, the devices of the present invention may also be constructed without the carbon films, provided that the remaining electrode layer in contact with the semiconductor layer is fully compatible with the semiconductor material.)

It is worth noting that our U.S. patent application Ser. No. 936,552 filed concurrently herewith and entitled "Thin Film Electrical Devices With Amorphous Carbon Electrodes And Method Of Making Same" discloses and broadly claims various aspects of the subject matter of FIGS. 1 through 8B presented below.

In the Figures, there are shown several electrical devices of the present invention all of which are current-carrying solid-state semiconductor devices having a plurality of electrodes, a plurality of thin films of carbon material associated with the electrodes, and a body or layer of semiconductor material in intimate electrical contact with the thin films of carbon material. Each of the electrodes are in intimate electrical contact with its respective thin film of carbon material such that current flows into one electrode through its layer of carbon material through the semiconductor material into the second layer of carbon material and from there into the second electrode.

Figure 1:
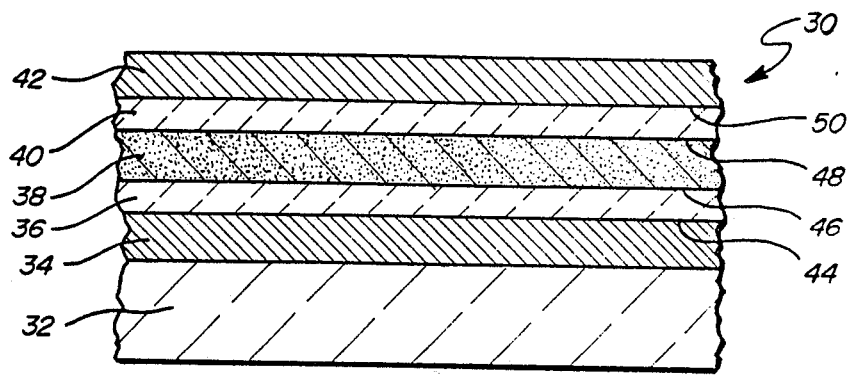
FIG. 1 is a partial side view in cross-section of an electrical device of the present invention.

Referring now to FIG. 1, there is shown an electrical device 30 of the present invention which is preferably a threshold switching device, and which utilizes a pair of conductive films of carbon material as barrier layers disposed between a center layer of semiconductor or active material and upper and lower metallic electrodes. Each film of carbon material may be considered as part of the electrode to which it is adjacent. The device 30 is formed on a substrate 32 which may be conductive or insulating, as required for the device application. Stainless steel, copper, and aluminum are examples of suitable conductive substrates, while glass, crystal silicon and crystal sapphire wafers are examples of insulating substrates. Successively deposited above the substrate 32 are a region or layer 34 of electrode material, a film 36 of carbon material, a body or layer 38 of semiconductor or active material, an upper region or film 40 of carbon material, and a top metal electrode 42.

The electrodes 34 and 42 are preferably formed of molybdenum, although they can be any other suitable highly conductive material, preferably those with high melting points and which are relatively inert with respect to the semiconductor material of layer 38, such as tantalum, niobium, tungsten, molybdenum, and tantalum-tungsten alloy. The films 36 and 40 are electrically conductive, non-single-crystal, phase-stable, non-switching carbon material. The thin film 36 is in intimate electrical contact with the electrode 34 at interface 44 and with the semiconductor layer 38 at interface 46. The film 40 of carbon material is in intimate electrical contact with the semiconductor layer 38 at interface 48 therebetween, and with upper electrode 42 at interface 50 between film 40 and electrode 42.

The electrode layers 34 and 42 may be deposited using any conventional or suitable technique such as sputtering, evaporation, vapor deposition, or the like. Preferably, the electrode layers are deposited as amorphous films by maintaining the temperature of the surface upon which they are being deposited sufficiently cool, so that the atoms condense into a generally disordered or amorphous state upon contacting the deposition surface.

The films of carbon material 36 and 40 are preferably deposited using DC magnetron sputtering. Typical process parameters are a substrate temperature about 100 degrees C., a pressure of 0.5 pascal, a deposition rate of 200–300 angstroms per minute, and a distance of approximately 6 centimeters between source and target. The resultant film of carbon material which results under these conditions is uniformly amorphous (a-carbon). Preferably, a pure carbon source is used so that the resultant film is substantially pure carbon. As used herein, pure carbon source means a source of material that is at least 99.9 percent carbon and preferably is 99.99 percent more pure carbon. When amorphous carbon is sputtered under such conditions, it may have a resistivity as low as about 0.25 ohm-centimeters.

More detailed information about the process for sputtering such conductive thin films of substantially amorphous carbon, and the electrical and structural characteristics of such films is provided in N. Savvides, "Fourfold to Three-fold Transition in Diamond-Like Amorphous Carbon Films: A Study of Optical and Electrical Properties", *Journal of Applied Physics*, Vol. 58, No. 1, pp. 518–521 (July, 1985), which is hereby incorporated by reference.

The threshold switching material or other active material of layer 38 may be deposited using any suitable or conventional technique well-known to those in the art. The preferred threshold switching materials used for layer 38 in the FIG. 1 device (and in the active layer of the devices shown in the other Figures) are films of amorphous semiconductor material which include one or more chalcogenide elements, i.e., sulphur, selenium and tellurium. (However, any type of semiconductor material which exhibits suitable switching behavior useful for overvoltage protection, voltage clamping or other electronic applications may also be used in the devices of the present invention.)

A preferred composition for layers 34–42 of device 30 when device 30 is used as a thin film threshold switching device is disclosed in Table I below. Table I lists exemplary materials and exemplary ranges of thicknesses for threshold switching devices of FIG. 1 and the other figures. A typical thickness for sample devices constructed and tested are also given. The thickness values are in angstroms.

TABLE I

| Reference Numeral | Exemplary Material | Range of Thicknesses | Typical Thickness |
| --- | --- | --- | --- |
| 42 | molybdenum | 1,500–25,000 | 5,000 |
| 40 | a-carbon | 100–2,000 | 1,000 |
| 38 | $Te_{39}As_{36}Si_{17}Ge_7P_1$ | 100–50,000 | 5,500 |
| 36 | a-carbon | 100–2,000 | 1,000 |
| 34 | molybdenum | 1,500–25,000 | 5,000 |

In fabricating device 30, it is highly preferred to deposit the layers 34 through 42 in sequence while substrate 32 is continuously maintained under a partial vacuum. This helps ensure that extremely clean interfaces are formed between the layers, and greatly reduces the chance for any appreciable amount of contaminants such as air, water vapor, dust or the like to contaminate the interfaces. This not only helps ensure fine physical integrity of the interfaces 44–50, but also helps ensure the formation of high quality electrical interfaces between the layers. Such clean interfaces are believed to help greatly reduce possible localized heating effects and nucleation sites for undesired localized crystallization of the semiconductor materials, which may well adversely affect the electronic repeatability and long-term stability of the device.

As indicated in Table I, the layers 34–42 and device 30 are preferably thin film. As used herein, the term "thin film" typically refers to a film having a thickness of less than five microns. Those in the art will appreciate, however, that for certain applications it is possible to scaleup the indicated thicknesses of the embodiment of the present invention so that at least some of the layers, such as the semiconductor layer 38 or electrode layers 34 and 42, may be thicker than five microns.

The thickness of the semiconductor film (layer 38) is related to the specified threshold voltage $V_{TH}$) which is desired, and may be adjusted in a manner well understood in the art. On the average, the threshold voltage of threshold-type semiconductor materials such as that listed in Table I is approximately 15 volts per micron of conduction path length. Therefore, in order to achieve a threshold voltage on the order of 8 to 9 volts in a vertical threshold device of the type shown in FIG. 1, for example, layer 38 is made approximately 5200 angstroms to 6000 angstroms thick.

The thickness of the various thin films used in the FIG. 1 structure, as well as the other structures of the present invention, may be readily controlled using any one of several techniques well known in the art. Those in the art will readily appreciate the threshold voltage of the device 30 may be made much higher or much lower simply by increasing or decreasing the thickness of the semiconductor layer 38.

In operation of the electrical device 30, current from its first electrode passes through at least one portion of the first carbon layer, through at least a filamentary path or portion of the semiconductor material and through the second carbon film to the second electrode. Since current takes the path of least resistance, which should always be through the shortest or more direct route through material of uniform resistivity, the current conduction path in the thin carbon films 36 and 40 and the semiconductor layer 38 of FIG. 1 should be substantially vertical.

In recent experiments with structures of the type shown in FIG. 1 and other Figures herein, it has been confirmed that the pore saturation current density of the threshold switches of the present invention is about $2 \times 10^4$ amps per square centimeter. It also has been confirmed that this current density remains substantially constant, even as the amount of current changes. Accordingly, it is believed that the cross-sectional area of a filamentary current path through threshold switching semiconductor material expands in correspondence to any increase in current and contracts in correspondence to any decrease in current. The conduction mechanism in threshold switching materials is well understood to be electronic rather than thermal in nature. The electronic nature of the initiation of threshold switching, of the on-state and the recovery process in threshold switching devices is discussed at length at D. Adler, et al., "Threshold Switching In Chalcogenide-Glass Thin Films", *Journal of Applied Physics*, Vol. 51, No. 6, pp. 3289–3309 (June, 1980), the disclosure of which is hereby incorporated by reference.

One important advantage of the structures of the present invention, including the FIG. 1 structure, is that they have excellent long-term D.C. (direct current) stablity. In a conventional threshold switching device, the threshold voltage value changes after one or several exposures to D.C. pulses which switch the device to its on-state and cause relatively large currents to pass therethrough. This change is believed due to thermal or electrothermal migration of electrode materials or processing residue into the active or semiconductor layer, and the resultant alteration of the morphology and/or chemistry of that layer. For example, it is known that as threshold switching material (or phase-change memory material) heats up, its threshold voltage value is lowered, but when it cools off, the threshold voltage value returns nearly to its original value. However, the threshold voltage value gradually degrades as the number of D.C. pulse-induced heating events increases. In contrast, in the prototype devices of the present invention we have constructed, the threshold voltage value always returns to its original value, even after multiple heating events caused by D.C. pulses. In a conventional device, the Problem of degradation of the threshold voltage value is even more severe when for a lengthy period of time D.C. current is passed continuously therethrough while the device is in its on-state. In contrast, our prototype devices show no appreciable change in threshold voltage value, even after continuously passing large D.C. currents for several days. Thus, the devices of the present invention are well suited for applications involving repeated or long-term exposures to D.C. currents or voltages, and are quite resistant to degradation due to heating effects.

Figure 2:
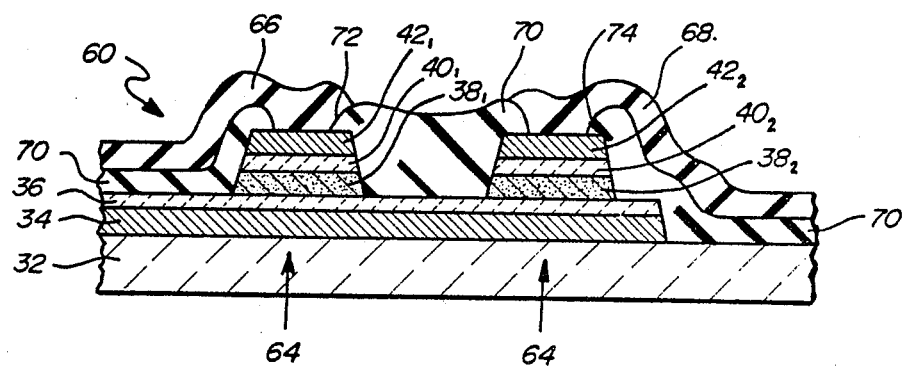
FIG. 2 is a partial side view in cross-section of two electrical devices of the present invention, each having a mesa structure disposed on a common bottom electrode.
Figure 3:
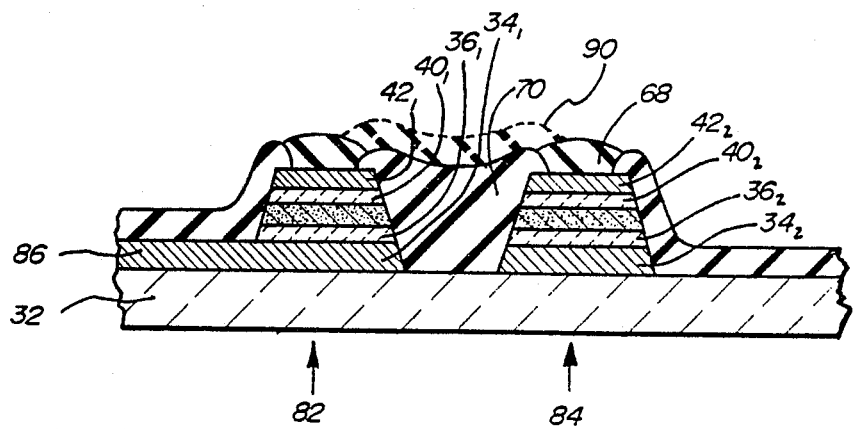
FIG. 3 is a partial side view of two alternative mesa structure devices of the present invention which are electrically isolated from one another.

While the basic device structure shown in FIG. 1 clearly has utility for many applications, it has been found desirable in certain applications to pattern some or all of the layers in the multiple layer structure shown in FIG. 1 into mesa structures, as is shown by way of example in FIGS. 2 and 3.

The FIG. 2 shows a thin film structure 60 including two mesa structures 62 and 64 arranged on a common substrate 32. The mesa structures 62 and 64 have conductors 66 and 68 respectively connected to their upper electrodes. The mesa structures 62 and 64 represent two distinct threshold switching devices having a common electrode. The overall structure 60 may be constructed by suitably patterning a multilayer structure 30 of FIG. 1 using conventional or suitable lithographic and etching techniques. The structure 60 includes a common electrode 34 and a common film of carbon material 36. In particular, the mesa structures 62 and 64 are formed by patterning layers 38, 40 and 42 into distinct sets of layers $38_1$, $40_1$, $42_1$ and $38_2$, $40_2$, $42_2$, as shown in FIG. 2. Once layers 38 through 42 have patterned, an insulating layer 70 is deposited over the entire structure. Layer 70 may be any suitable deposited thin film insulating material such as silicon oxide ($Si_xO_y$), silicon nitride ($Si_xN_y$) or preferably siliconoxynitride ($SiO_xN_y$). Layer 70 may range in thickness from about 0.3 to 2.5 microns depending in part on the combined thickness of layers 38-42, and is preferably about 0.6 micron thick for the typical thicknesses of layers 38-42 shown in Table 1. After layer 70 has been deposited conventional photolithographic and etching techniques are used to create openings or vias 72 and 74 therein above mesa structures 62 and 64. Thereafter, a top metallization layer is deposited over the entire structure 60 and may be patterned so as to provide individual conductive lines 66 and 68 to mesa structures 62 and 64, thereby allowing them to be accessed as separate electrical devices. Layer 34, as well as traces 66 and 68 may be connected to other thin film devices connected on the same substrate or to terminal pads (not shown) to provide easy connection to the threshold switching devices 62 and 64. The etching of the various thin film layers of structure 60 may be accomplished using conventional or suitable etchants, either wet or dry, known to those in the art.

FIG. 3 shows a thin film structure 80 containing two mesa structures 82 and 84 which include more patterned layers than do the mesa structures of FIG. 2. Specifically, layer 34 is shown partially etched away to form conductive pads $34_1$ and $34_2$ for mesa structures 82 and 84 respectively. These pads serve as the lower electrodes. Similarly, thin film carbon layer 36 has been etched into portions $36_1$ and $36_2$ as shown. The remainder of the processing steps may be carried on as previously described with respect to FIG. 2 in order to create distinct portions of layers 38, 40 and 42. The lower electrode $34_1$ of structure 82 is shown extending to the left so that contact may be made thereto at a portion 86 thereof. The lower electrode portion $34_2$ may be similarly extended in any direction, space permitting, to provide an electrical contact thereto. Thus, in mesa structures 82 and 84 both electrode layers, both carbon film layers and the semiconductor layer have been patterned, so as to form a completely isolated threshold switching device. If desired the top metallization layer, which is shown patterned into traces 66 and 68, can be interconnected by a connecting portion of 90 which can be patterned at the same time as conductor 66 and 68. In this manner, devices 66 and 68 can be connected in parallel if desired for increased current-carrying capability or for any other circuitry purpose.

Figure 4A:
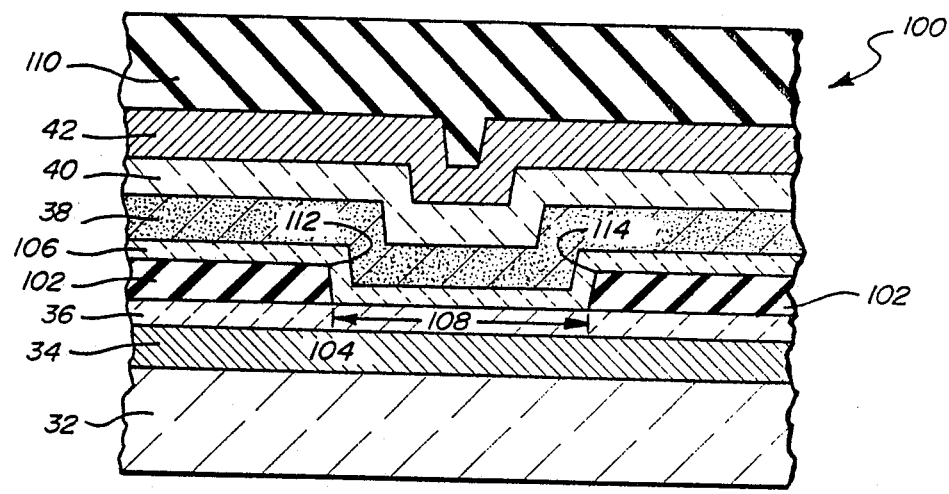
FIGS. 4A, 4B and 4C are partial side views of electrical devices of the present invention having a vertical conduction path formed through an opening in an insulating layer.

Thin film structure 100 of FIG. 4A is another vertical embodiment of the present invention. In addition to the layers 34 through 42 previously mentioned, structure 100 features two additional layers, namely an insulating layer 102 which has an opening or pore 104 therein and an additional, very thin layer of carbon film 106 deposited on top of insulating layer 102. The layers 102 and 106 are sandwiched between the thin film carbon layer 36 and semiconductor layer 38, as shown. The horizontal length 108 of the opening 104 may be any desired size such as ten microns, five microns, or less. The thickness of insulating layer 102 may range from 1,000 to 10,000 angstroms or more and preferably between 2,400 to 6,000 angstroms. A highly conductive top metallization layer 110, preferably made of aluminum and on the order of 0.5 microns to about 2.0 microns thick, and in intimate electrical contact with upper electrode 42 may be provided if desired to increase ampacity of electrode 42 and improve heat dissipation. Like in the FIG. 4B device, the structure 100 of FIG. 4A may be patterned into a mesa structure if desired simply by etching through the various layers a short distance (such as 2 to 10 microns) outside of the top left edge 112 and top right edge 114 of the opening 104.

Figure 4B:
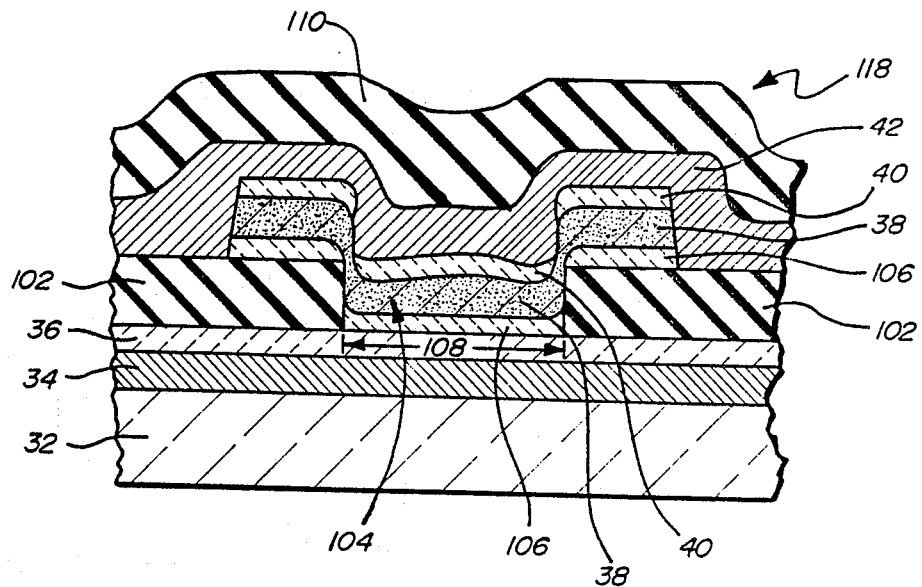

The mesa structure 118 shown in FIG. 4B is formed using the same basic structure 100 shown in FIG. 4A, except that layers 106, 38 and 40 may be patterned as shown prior to the deposition of layer 42. When layer 42 is deposited, it overlies and extends beyond the mesa structure formed by patterned layers 106, 38 and 40, thus providing a cap or passivation layer which acts to hermetically seal the layers 106, 38 and 40 from possible exposure to adverse environmental conditions. Thereafter, the top metallization layer 110, which is preferably aluminum, may be deposited, and if desired, patterned into a suitable shape for a conductor.

To fabricate the structures 100 and 118, the layers 34, 36 and 102 are deposited in sequence, preferably while under a continuous partial vacuum. Thereafter, a layer of photoresist is deposited on top of insulating layer 102, and exposed and developed so as to create a suitable mask for forming the opening 104 in layer 102. Thereafter, layer 102 is etched with a suitable solvent or dry etchant to form opening 104. The photoresist mask is thereafter removed. In order to ensure a high integrity interface between the semiconductor material and the bottom electrode 34, a partial vacuum is established, and thereafter layers 106, 38, 40 and 42 are subsequently deposited while substrate 32 remains continuously in the partial vacuum. Layers 106, 38 and 40 may be and preferably are deposited through a metal mask having a suitably sized opening which is brought into position so that its opening is centrally located above opening 104. If desired, layer 42 may also be deposited through another metal mask having a slightly larger opening centrally located above opening 104. Depositing layers 106, 38 and 40 through a mask makes it unnecessary to expose the active layer 38 to any etchants or photoresist materials which could possibly contaminate the layer 38 such as by producing undesired surface states.

Layer 106 may range in thickness from 30 angstroms to 300 angstroms and is preferably 60 to 200 angstroms in thickness, with 60 to 100 angstroms being most preferred. Depositing layer 106 before depositing the semiconductor or active layer 38 produces at least two advantages. Firstly, when layer 106 is made of the same material as layer 36, which is strongly preferred, there is little if any electronic effects or interactions at the interface between the layers, and a very good mechanical bond and minimally resistive electrical connection is created between the two layers. Secondly, active layer 38 can thereafter be deposited on the top surface of layer 106, while it is still in a virgin or pristine condition (since it was just deposited) by maintaining a continuous partial vacuum while layers 106, 38 and 40 are being deposited. This procedure thus ensures that the interfaces between active layer 38 and barrier layers 106 and 40 are substantially free of contaminants and defects induced by exposure to air.

In the FIG. 4B device, the insulating layer 102 is shown to be considerably thicker than corresponding layer 102 in FIG. 4A. For example, if the combined thickness of layers 106, 38 and 40 is 6,600 angstroms, insulating layer 102 in FIG. 4A can be made 6,500 angstroms thick and preferably somewhat thicker, such as 8,000 to 12,000 angstroms thick. Also, the side walls or surface of insulating layer 102' defining the opening 104 in FIG. 4B are shown to be more nearly vertical than the side walls defining opening 104 in FIG. 4A. Such steeply sloped or substantially vertical side walls can be produced by anisotropic dry etching processes, such as reactive ion etching, as is well known in the art. On account of the thicker insulating layer and steeper side walls, the central portions of layers 106, 38 and 40 are disposed in the opening 104 substantially below the outer portions of layer 106, 38 and 40, which are disposed above the insulating layer 102, thus helping to ensure that the effective cross-sectional area of the active layer 38 able to conduct current is physically limited to the cross-sectional area of the opening. This helps control leakage currents through the structure, and thus making the off-resistance of the electrical device more predictable. It also allows the layer 42 to effectively hermetically seal the portion of the active layer 38 within said opening.

Figure 4C:
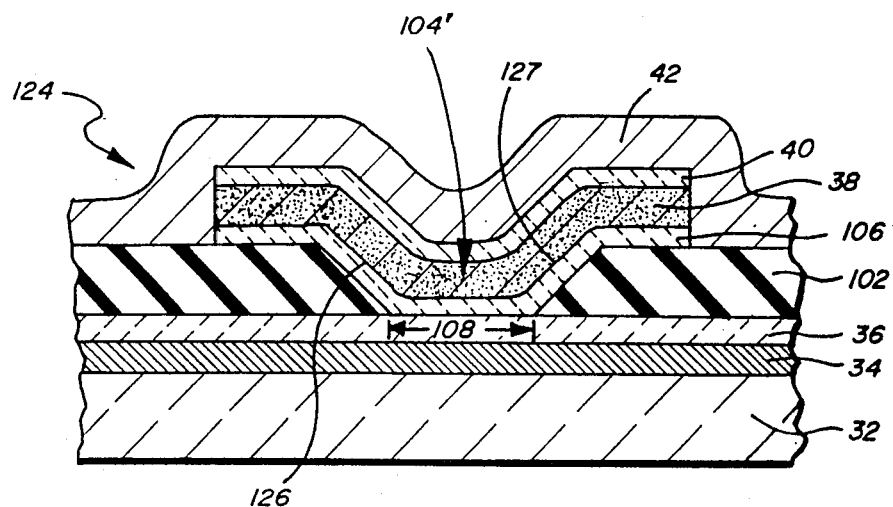

The electrical device 124 shown in FIG. 4C is constructed in a manner identical to the structure 118 shown in FIG. 4, except that the surface which may be composed of one or more surface portions of insulating layer 102 defining the opening 104' has a substantially sloping side wall, as can be seen as sloping surface portions 126 and 127. The sloping side wall may be produced, for example, by isotropically etching away the central portion of insulating layer 102 using any conventional or suitable wet etchant, which results in an arcuate etched surface familiar to those in the art. Alternately, dry etching processes involving energetic particle bombardment of the layer to be etched in the vertical direction, and chemical etching due to reactive gas species in all directions, can be used to form a sloping surface such as surface portions 126 and 127 shown in FIG. 4C. For example, reactive ion etching may be used to form the sloped side wall of opening 104' by adjusting the cathode-to-substrate bias voltage, pressure and gas flow rate to control the vertical-to-horizontal etch ratio, thereby obtaining the desired degree of sloping. The average degree of sloping as measured from the horizontal face of layer 38 and depending on the material being deposited, may be in the range from about 30° to about 70° and is preferably between about 35° and about 55°, e.g., 45°.

The structure 124 shown in FIG. 4C has at least one advantage over the structure described in FIGS. 4A and 4B, namely, it is substantially free of step coverage problems. On occasion, we have observed that in a circular opening several microns in diameter and having substantially vertical side walls in an insulating layer approximately 5,500 angstroms thick, such as layer 102, the semiconductor or active layer 38 is not always uniformly deposited therein. This is believed due to step coverage problems such as voids and overhangs. This nonuniformity may well produce variations in the thickness of the active layer 38 in the opening in the insulating layer 102 as severe or more severe than those shown in FIG. 4B. Such variations in thickness or other step coverage problems can result in uncontrolled variations in key electrical characteristics of the active layer, such as the threshold voltage value. Sloping these side walls substantially eliminates the step coverage problems, and should greatly assist in providing very uniform device characteristics. Furthermore, as explained below, structure 124 need not exhibit any more leakage current than expected from an opening having the same diameter 108 as structure 124, since the minimum effective cross-sectional area of the opening is determined by the diameter 108.

Carbon barrier layers 36, 106 and 40 can be omitted from the FIG. 4C structure, if desired, so that electrode layers 34 and 40 directly contact the active layer 38. When layer 106 is used, and it is desired to keep the effective cross-sectional area of the device 124 substantially equal to the area of the smallest part of the opening (i.e., at the bottom thereof), layer 106 should be kept as thin as practical, and layer 106 should be fabricated with a resistivity sufficiently high so that the lateral resistance of layer 106 such as along sloping surface portions 126 and 127 does not substantially add to any leakage current which flows through the device under normal operating conditions. This effectively eliminates the sloping portions of layer 106 as a source of additional leakage current. The pure amorphous carbon material disclosed above can be readily deposited with almost any desired resistivity by simply adjusting the sputtering power density. Other barrier layer materials known to those in the art which are substantially inert with respect to the active layer 38 and which have or (can be modified to have) suitable resistivity may be used in place of carbon material in layer 106.

The FIG. 4C structure is believed to be particularly suitable for memory cells having an opening or pore size less than 10 microns in diameter, especially a pore between about 1 micron and about 5 microns in diameter. The structure in FIGS. 4A through 4C show the use of three carbon layers 36, 106 and 40. If desired, layer 36 may be omitted, so that layer 106 makes direct contact with electrode layer 34. When layer 36 is omitted, it is preferably to increase the thickness of layer 106 somewhat to 200 to 500 angstroms or more.

Figure 5A:
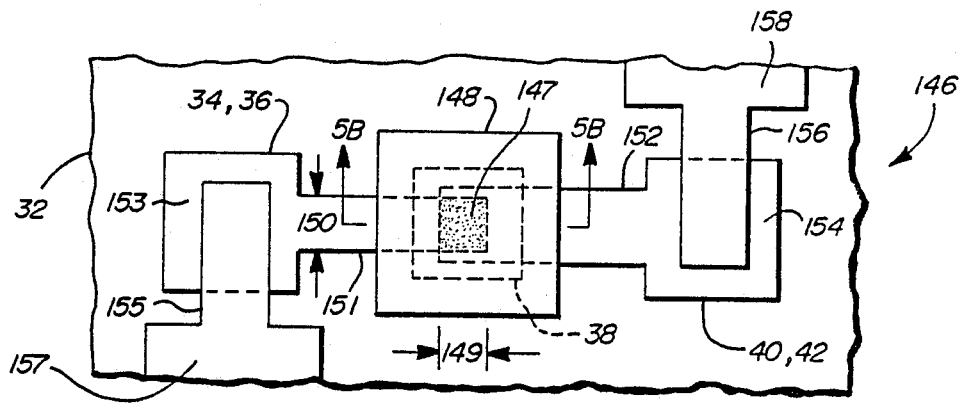
FIG. 5A is a partial plan view of another electric device of the present invention which has a fully encapsulated active region.
Figure 5B:
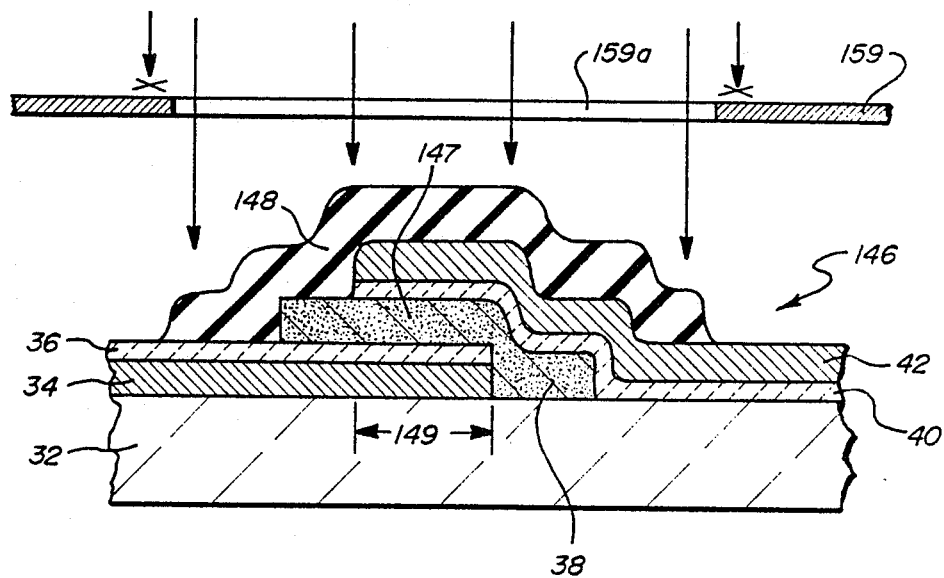
FIG. 5B is an enlarged cross-sectional side view taken along line 5B—5B in FIG. 5A.

Thin film structure 146 of FIGS. 5A and 5B is another electrical device of the present invention having a vertical conduction path 147, which is only in the crosshatched region of FIG. 5A between the lower and upper electrodes. Device 146, which may be constructed on any substrate 32 having an insulating surface, includes a bottom electrode comprised of metallic electrode layer 34 and thin film carbon layer 36, active layer 38 of threshold switching material, and a top electrode comprised of thin film carbon layer 40 and metallic electrode layer 40, all preferably patterned and operatively arranged as shown. The central active portion of the device 146 is fully encapsulated or hermetically sealed by passivating layer 148 of insulating material relatively inert with respect to the various layers thereunder, particularly layer 38. The cross-sectional area of conduction path 147 is determined by the amount of longitudinal overlap 149 and transverse overlap 150 between finger portion 151 of the bottom electrode and finger portion 152 of the top electrode. In the illustrated embodiment, the transverse overlap 150 equals the width of smmaller finger portion 151. The bottom and top electrodes also include larger contact portions 153 and 154 respectively positioned away from the central region of device 146, where electrical interconnections may be made to the device. Still larger contact electrodes 155 and 156 respectively having contact pad portions 157 and 158 (partially shown) may be provided if desired to permit soldering or other coarse bonding techniques to used to make electrical connections to the device. Our prototypes of device 146 were constructed on a single-crystal silicon wafer having a thermally grown silicon oxide surface layer as indicated in Table II (thickness in angstroms):

TABLE II

| Reference Numeral | Exemplary Material | Range of Thicknesses | Typical Thickness |
| --- | --- | --- | --- |
| 155, 156 | aluminum | 1,500–2,500 | 2,000 |
| 148 | silicon monoxide | 1,500–2,000 | 1,500 |
| 42 | chromium | 1,500–2,500 | 1,500 |
| 40 | a-carbon | 500–1,000 | 1,000 |
| 38 | $As_{34}Te_{28}S_{21}Ge_{16}Se_1$ | 4,000–6,000 | 5,000 |
| 36 | a-carbon | 500–1,000 | 1,000 |
| 34 | chromium | 1,500–2,500 | 1,500 |

Several hundred devices were made simultaneously on the substrate, which then was diced up to obtain individual devices inserted into DO-18 packages for testing. Our prototype devices 146 demonstrated excellent long-term D.C. stability, even when operating at temperatures between 100° C. to 150° C. We attribute the success of these prototypes of device 146 to the use of amorphous thin film carbon as barrier layers to help stabilize the morphology of active layer 38, and to the preferred fabrication and sealing of the central region of device 146 in a continuous partial vacuum.

In our preferred method for making device 146 prototypes, substrate 32 was cleaned with a conventional wet etch and then placed in a vacuum deposition chamber, which was then pumped down and maintained at the desired vacuum levels required for the various directional electron beam sputtering or thermal evaporation steps. Layers 34 through 42, and layer 148 were successively deposited as shown using for patterning four metal masks, each having an opening corresponding to the desired outline of the layer or layers deposited therethrough. Each mask was moved as needed into close proximity to the substrate and carefully aligned. In the continuously maintained partial vacuum, bottom electrode metallic layer 34 and carbon layer 36 were deposited through the first mask, active layer 38 was sputtered through the second mask, upper electrode carbon film layer 40 and metallic layer 42 were deposited through the third mask, and passivating layer 148 was sputterred through the fourth mask. In FIG. 5B, a portion 159 of the fourth mask, having an opening 159a is schematically shown in aligned position relative to the substrate 32. The vertical spacing between the four masks and substrate was within a suitable range of distances such as 20–50 microns. The six vertical arrows in FIG. 5B depict the relative direction of travel of material 148 perpendicular to substrate 32 as it is being deposited through the opening 159a in the fourth mask. The minimum size of the opening in our metal masks was on the order of 25 microns, which corresponds to dimension 149 shown in FIG. 5A. Since techniques for depositing materials by sputtering or evaporation through masks have long been well known in the art, further details of same need not be provided here. The foregoing method of making device 146 helps ensure that layer 38 therein is deposited and remains in a pristine state, since layer 38 received no appreciable exposure to air, water vapor, or etchants, processing gases, effluents or residues associated with conventional wet or dry Photolithographic patterning techniques, which might otherwise help produce in layer 38 surface states, leakage paths (especially along side surfaces and edges), and other contamination-related problems.

Figure 6:
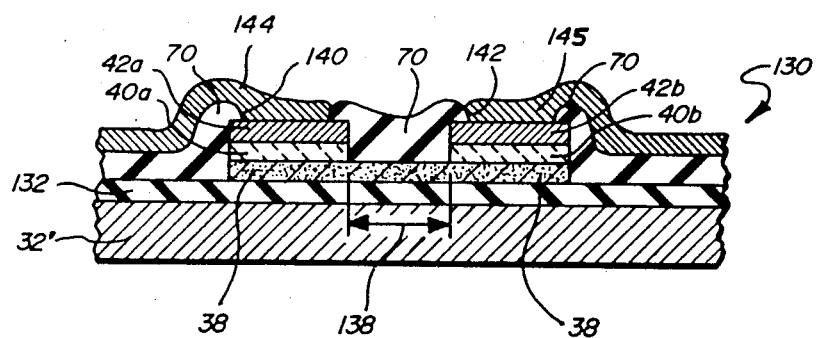
FIG. 6 is a side view in cross-section of a horizontally arranged electrical device of the present invention.

Structure 130 in FIG. 6 is a horizontal embodiment of an electrical device of the present invention. One advantage of the horizontal device over the vertical structures shown in the previous Figures is that it has fewer layers and accordingly fewer fabrication steps are required. However, the horizontal device requires more area than a typical vertical structure having one electrode located vertically above the other electrode. The substrate 32' is shown to be a conductive material, preferably a metal such as copper or a metal alloy which has high thermal conductance to help dissipate heat generated during the operation of device 130. The layer 132 is an electrical insulating material such as deposited diamond, siliconoxynitride, beryllium oxide, alumina, sputtered quartz or like, which has relatively good thermoconductance properties so that heat may be relatively efficiently transferred from semiconductor layer 38 to the substrate 32' which serves as a heat sink. The thickness of layer 132 is preferably 100 angstroms to 500 angstroms thick or more. The thickness required depends upon the dielectric qualities of the insulating material chosen for layer 132 as well as the potential difference experienced between the substrate 32' and the semiconductor layer 38 during operation.

The structure 130 includes a first and second electrode 42a and 42b and a first and second carbon film 40a and 40b associated with these two electrodes. In operation, the current flows into one of the electrodes, such as electrode 42a, through which associated carbon film 40a, then horizontally through semiconductor layer 38, and then vertically through the second carbon film 40b associated with a second electrode 42b. When made of amorphous chalcogenide semiconductor materials, layer 38 should be on the order of 0.5 microns to 2 microns or thicker in order to be able to support a high current density, filamentary or plasma-like conduction current therethrough.

The structure 130 may be fabricated as follows. After cleaning substrate 32′, the insulator layer 132 is deposited, and annealed if desired to improve its dielectric qualities. Thereafter, in a continuously maintained partial vacuum, the semiconductor layer 38, the thin film carbon layer 40 and electrode layer 42 may be deposited in sequence. Thereafter, using suitable lithographic and etching techniques, the electrode layer 42, the thin film carbon layer 40 may be etched as shown. Then a suitable photoresist may be applied over an entire structure and patterned so that a central portion 138 of the semiconductor layer is not subject to etching, while the portions of the semiconductor layer 3B everywhere except under the electrodes 42a and 42b are etched away by a suitable etchant. After removing a photoresist layer used for such patterning, the layer 70 of insulating material is deposited and patterned so as to create vias 140 and 142 to allow a top metallization layer to make electrical contact with the electrodes 42a and 42b. Thereafter, the top metal layer may be patterned into conductors 144 and 145 as shown. If desired, the top metallization layer can be made reasonably thick such as 1.0 to 2.5 microns or more to help provide an additional route for heat to escape from the structure 130.

Figure 7:
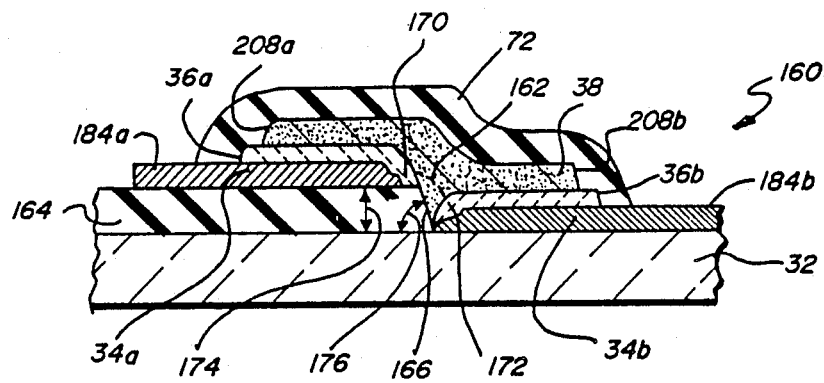
FIG. 7 is a side view of an electrical device of the present invention having a diagonal current conduction path.

Thin film structure 160 shown in FIG. 7 is another embodiment of the present invention which is well suited for use as a threshold switching device. The structure 160 features a substantially diagonal current conduction path in the general direction suggested by dotted line 162 between the two electrodes as will shortly be further explained. The structure 160 includes a layer of patterned insulating layer 164 provided with a sloped or diagonal face 166 in the vicinity of the current conduction path. The first electrode 34a and its associated carbon film layer 36a are disposed on top of the patterned insulating layer 164. The second electrode 34b and its associated carbon film layer 36b are located on the substrate 32 adjacent to the face 166 of insulating layer 164. The electrodes 34a and 34b are spaced apart from each other. Their respective carbon film layers 36a and 36b are also spaced apart from one another as shown. The part 170 of carbon layer 36a and the part 172 of carbon layer 36b are the portions of those thin film carbon layers which are closest to one another, and are diagonally spaced apart from one another. The semiconductor layer 38 is deposited on top of the thin film carbon layers 36a and 36b and extends at least between the nearest portion 170 and 172 of the carbon layers 36a and 36b to provide a current conduction path therebetween. The length of the current conduction path largely dependent upon the height 174 of insulating 164 and the angle 176 between the face 166 of layer 164 and the substrate 32. Accordingly, the length of the current conduction path 132 may be readily controlled by adjusting the thickness 174 and angle 176 of the insulating layer 164. To avoid degradation of the semiconductor material 38, the structure 160 is preferably provided with a passivating layer 72 which encapsulates the Patterned semiconductor layer 38 as shown. Connections to the semiconductor device of structure 160 may be made at in extending portions or paths 184a and 184b of electrodes 34a and 34b respectively.

Figure 8A:
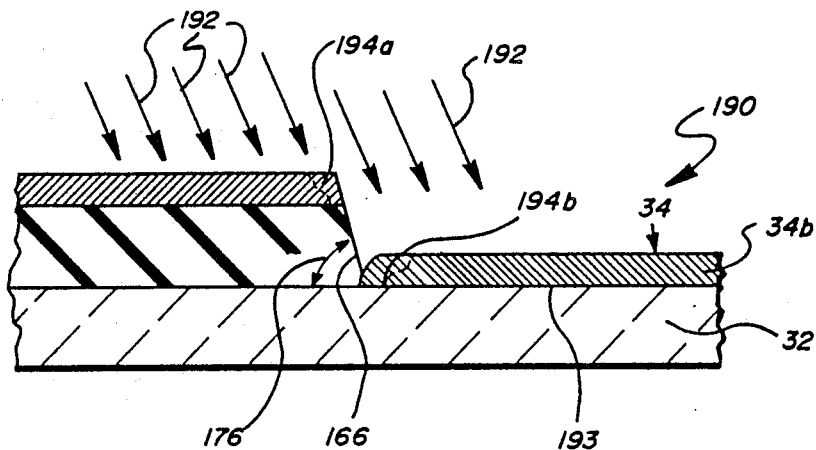
FIGS. 8A and 8B are side views of the FIG. 6 device when partially constructed illustrating its method of construction.
Figure 8B:
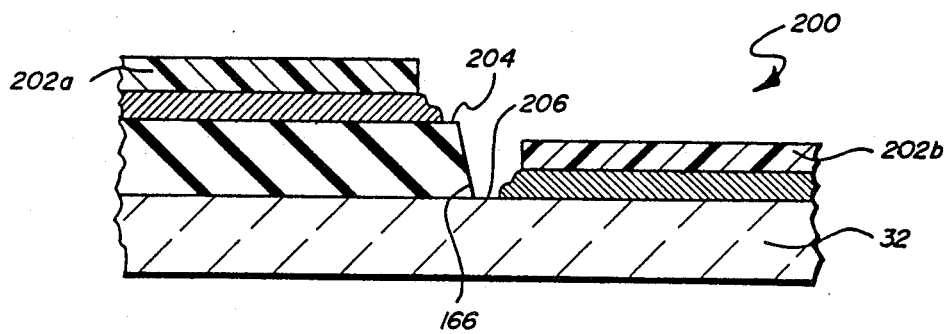

A preferred method for fabricating the structure 160 shown in FIG. 7 is disclosed in the partially completed structures of FIGS. 8A and 8B. To create the partially completed structure 190 of FIG. 8A a layer of insulating material 164 is deposited on substrate 32, and a layer of photoresist is deposited thereover and patterned into a mask 1490.2 required for the etching step which immediately follows. Layer 164 is then subject to a suitable anisotropic dry etch which removes the right half of the layer, and in so doing leave angled face 166. The anisotropy of the dry etching step is controlled so as to produce a rather steep angle 176 on the order of 45 to 90 degrees. Then, the photoresist mask is removed. Next, the electrode layer 34 is directionally sputtered onto the substrate 32 and patterned insulation 164 as shown by arrows 192 so as to deposit electrode material on top of the insulating layer 164 and on on a surface portion 193 of the substrate 32, without depositing much if any electrode material on the face 166.

Partially completed structure 200 in FIG. 8B depicts several processing steps after the deposition of electrode layer 34. First, a layer of photoresist material 202 is deposited and patterned into mask 202a and 202b as shown in electrode layer 34a and 34b. Thereafter, the electrode layers 34a and 34b are subjected to an isotropic wet etch to remove the corner portions 194a and 194b indicated in FIG. 7, thereby recessing the electrode layers 34a and 34b slightly away from the face 166, as indicated by spaces 204 and 206. The photoresist mask 202a and 202b are then removed. A carbon electrode layer 36a and 36b are then directionally sputtered in a partial vacuum onto the electrodes 34a and 34b at an angle such as that which was used to deposit the electrode layers 34 as depicted in FIG. 7. In this manner, substantially no carbon material is deposited upon face 66. Then, without breaking vacuum, the semiconductor layer 38 is deposited over the carbon electrode layers 36a and 36b. Layer 38 is then patterned to form side surfaces 208a and 208b. The thin film carbon layers 36a and 36b can also be patterned as shown. These two patterning steps expose the electrode portions 184a and 184b. The passivation layer 72 is thereafter deposited and patterned as shown so as to once again expose the extending portions 184a and 184b of electrodes 34a and 35b. If desired, carbon layer 36, semiconductor layer 38 and passivating layer 72 can each be patterned in said vacuum by depositing each of the layers through suitable metal masks provided with opening therein, in the manner described with respect to FIG. 4B.

Except for FIG. 5A, FIGS. 1 through 8 do not show any plan views of the structures of the present invention. However, those skilled in the art will readily appreciate that the structures shown therein can be formed in a variety of sizes and shapes. For example, the opening in the insulating layer of FIG. 4 may be made circular, square, rectangular, or any other desired shape. Similarly, the distance between electrodes in FIG. 5 may be adjusted.

FIG. 9 shows a preferred embodiment of an all thin film electrical overvoltage protection device 220 of the present invention having multiple diagonal current conduction paths, which increases reliability by reducing the concentration of localized heating effects therein. A preferred method for constructing the structure 220 is illustrated in FIGS. 10 and 11. As with the FIG. 7 structure, only one layer of thin film carbon need be deposited to make structure 220. Structure 220 preferably has a highly thermally conductive substrate, which may be any suitable material or combination of materials, such as copper substrate 32′ which may be covered with an insulating layer 132, like in the FIG. 5 embodiment. Over insulating layer 132 is bottom electrode layer 34, which is covered by thin film carbon layer 36. An insulating layer 222 and conductive electrode forming layer 224 such as molybdenum are deposited one after the other on top of layer 36 and subsequently patterned as shown in FIG. 10, using a patterned photoresist layer 229 and dry etching techniques, into a plurality of spaced mesa structures such as structures 226 and 228, which respectively include patterned electrodes 222a, 224a and 222b, 224b of layers 222 and 224. Between the adjacent mesa structures are channels, such as channel 230 between which is defined by opposed facing edges of mesa structures 226 and 228 and the portion of layer 36 therebetween. After removing photoresist 229, the patterned electrodes of layer 224 which remain are subjected to a wet etch with a suitable solvent that attacks only layer 224, to obtain the reduced size electrodes such as segments 224a and 224b shown in FIG. 9.

Next, a layer 232 of thin film carbon material, which may be 60 to 200 angstroms thick for example, is deposited over the mesa structures and channels, such that selected portions of layer 232 end up lining the bottom of the channels illustrated by portion 232' in channel 230, while other portions of layer 232, such as portion 232", end up on top of the mesa structures as shown in FIG. 11. Thereafter, a layer 38 of threshold switching material is deposited over the discontinuous portions of layer 232 and substantially fills the channels, as illustrated by portion 38a in channel 230.

A second layer 233 of photoresist is then deposited and patterned as shown in FIG. 11 in preparation for the etching of layers 38 and 232. Both layers 232 and 3B are then patterned to provide openings above the mesa structures between the dotted lines 238 in FIG. 11. As shown in FIG. 9, this leaves portions of layer 232 on top of the mesa structures such as portions 232a and 232b respectively positioned on top of mesa structures 226 and 228 near channel 230. Next an insulating layer 240 is deposited and patterned as shown in FIG. 9 to open vias above the mesa structures such as vias 246 and 248 to permit electrical contact to be made between a subsequently deposited highly conductive top metallization layer 242 which is preferably sputtered aluminum and the patterned upper electrodes such as electrodes 224a and 224b formed from layer 224. Layer 242 is preferably patterned as shown to reduce stray capacitance between layer 34 and itself. After this patterning, layer 242 includes patterned sections above each mesa structure, such as segments 242a and 242b above mesa structures 226 and 228, which effectively each become the part of the upper electrode for the device below. Layer 242 also preferably includes connecting traces 242c and 242d as shown which electrically interconnect the sections above each mesa structure. Layer 242 is preferably made of sputtered aluminum which is preferred for its high electrical and thermal conductivity, low cost and compatibility with other semiconductor processes and materials. However, other sufficiently conductive material may be used for layer 242. To prevent diffusion of aluminum into layer 38, insulating layer 240 should be made from a material such as siliconoxynitride and have a thickness which will prevent the aluminum from layer 242 from migrating into layer 38.

When structure 220 is to be placed in operation, high quality electrical connections are made to layers 242 and 34 using a conventional technique such as downbonding to contact pads so that structure 220 is connected across or in parallel with a circuit or circuit element to be protected from overvoltage conditions. Accordingly, the upper electrodes made from layer 224 and its associated thin film carbon layer such as 232a are at one potential, while the bottom electrode layer 34 and its associated thin film carbon layer 36 at the bottom of the channels such as thin film carbon portion 232' at the bottom of channel 226 are at another potential. When the voltage across carbon layers 232a and 232' or 232b and 232' exceed the threshold voltage of switching layer 38 therebetween, a current filament is established between the carbon electrode layers 224a and 224b where indicated by dotted lines 250a and 250b. Thus two filamentary current conduction paths will be established in channel 230. Since carbon electrode layers 232a and 232b are skewed relative to and face away from the carbon electrode layer 232', the current filaments 250a and 250b should not expand into the central portion of the channel 230, but remain confined along the edges of the channel as shown by dotted lines 250a and 250b.

The thicknesses of the various layers in the FIG. 9 device may be approximately the same as those given with respect to the device in FIG. 4A, for example. Preferably, the insulating layer 222 used to produce the mesa structures should be sufficiently thick and carbon layer 224 should be sufficiently thin so as to result in a significant elevational difference between the bottom of the channel, such as channel 230, and the top of the insulating layer, so as to assure discontinuities between the upper and lower portions of the carbon layer in the manner depicted in FIG. 11.

Figure 12:
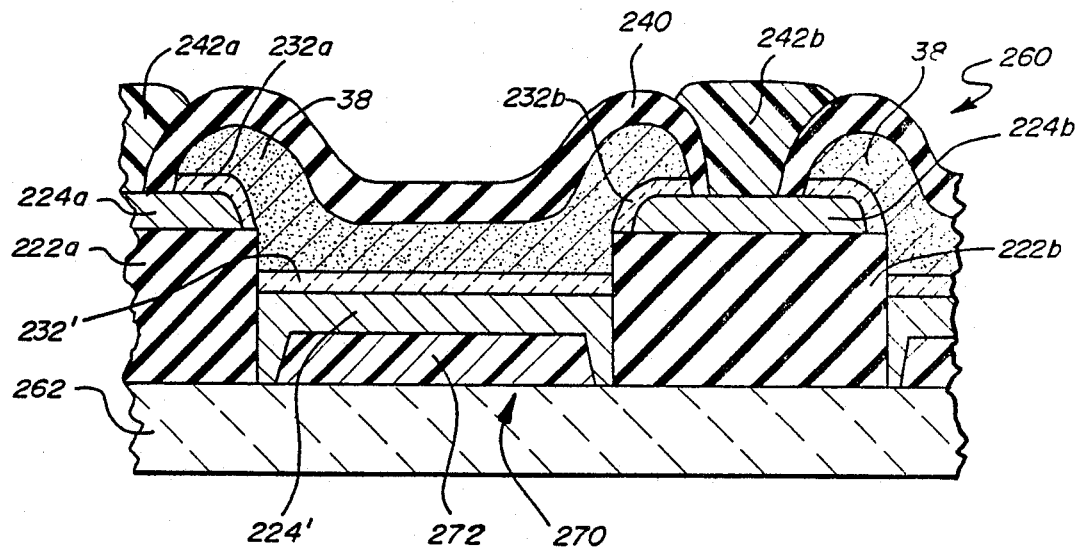
FIG. 12 is a partial side view of an electrical device of the present invention similar to that of FIG. 9, but with less capacitance.

Structure 260 shown in FIG. 12 is an alternative embodiment of the present invention constructing in a manner similar to that of structure 220 in FIG. 9, but has reduced inter-electrode capacitance, since its upper electrodes do not overlie its lower electrodes. The substrate 262 in FIG. 12 is an electrically insulating, thermally conductive substrate such as deposited amorphous diamond, sapphire, fused quartz or even single crystal silicon. Deposited amorphous diamond is particularly preferred due to its high thermal conductivity. An insulating layer 222 is deposited directly on top of the substrate 262, and patterned with photoresist techniques to form mesa structure 222a and 222b and provide a channel 270 therebetween. With the patterned photoresist still on top of the patterned mesa structures, a layer 272 of highly conductive electrode material, such as aluminum, is deposited over the entire structure in a thickness substantially less than that of the insulating layer 222. The photoresist is removed, and the portions of layer 272 remaining in the channel are thereafter patterned as shown by heavily attacking the layer with an isotrophic wet etch. This ensures that no aluminum remains on the upper side walls of mesa structure 38.

Next, an electrode-forming layer 224 is deposited over the patterned layers 222 and 272, and subsequently subjected to an isotropic wet etch to reduce its size to that shown in FIG. 12. This leaves segments 224a and 224b on top of insulating layer portions 222a and 222b respectively, while segment 224' is positioned in channel 270 substantially below the upper surface of layer 222. This elevational difference and etching ensures that upper electrode segments 224a and 224b are physically distinct and electrically isolated from the lower electrode segments 224b'. Thereafter, layer 232 of thin film carbon is deposited to serve as the barrier layer for both the upper and lower electrodes. Thereafter, the processing of structure 260 from this point on is substantially similar to that of similar layers or parts of structure 220 in FIG. 11. FIG. 12 shows that the patterned upper metallization layer segments 242a and 242b need not be interconnected, if this is not desired. Improtant advantages of the structures of FIGS. 11 and 12 is that they can be made with a reduced number of layers and aligned mask steps which have very large alignment tolerances.

It is preferable to provide an appreciable mass of thermally conductive material in intimate thermal contact with the upper and/or lower electrodes of the overvoltage protection devices of the present invention for maximum dissipation of any heat which may be generated during device operation, especially for high energy applications. This helps avoid localized concentrations of heat which may, in severe instances, result in ablation of the threshold switching material or electrode-forming layers adjacent to a local hot spot. Those in the art will appreciate that a relative thick, highly thermally conductive substrate, and a thick top metallization layer (whether patterned or continuous) will greatly help dissipate the heat. For some applications it may be sufficient to Provide such heat dissipation means in on one side of the devices of the present invention, such as the substrate side. However, it is preferred, where possible, to provide for such heat dissipation means on all electrode surfaces near Portions of the semiconductor body 38 where current filaments may form, particularly wherein threshold switching material having a high current density, such as above about 100 A/cm$^2$, is used for layer 38.

Ovonic threshold switching material has extremely high current densities, on the order of $2\times10^4$ A/cm$^2$. While these semiconductor materials are fairly rugged, radiation hard, and can withstand reasonable amounts of heating effects, the contacts made with the semiconductor material are more suspect due to resistive heating effects. In this regard, it it has been noted that most of the voltage drop across a threshold switching device made using such Ovonic switching materials occurs across the contacts when the device is being driven hard. Commonly, the voltage drop across a body of threshold switching material in an overvoltage protection device of this type is only approximately one tenth of a volt and is somewhat independent of filament length. This is due to the current conduction mechanism in Ovonic threshold switching materials being a plasma of both electrons and holes, wherein very little resistance to current flow is observed above the critical holding voltage or field required to sustain such a plasma, once initiated.

Since Ovonic switching materials have such high current carrying capacity, we believe that in high power devices employing such materials, care must be taken to minimize the resistive heating effects in the electrodes, lest such effects result in the degradation or destruction of the device under severe operating conditions. This can be done in part by minimizing the thicknesses and maximizing the cross-sectional areas of the barrier layer materials, such as thin film carbon and/or molybdenum, both of which are more resistive than preferred metallic conductors such as aluminum.

In FIGS. 13 through 16, various plan views of overvoltage protection devices of the present invention are shown which provide additional protection against concentrated localized heating effects. These embodiments have at least four important advantages over conventional threshold switching devices. Firstly, they avoid any concentrated localized heating effects by restricting the maximum width of a cross-sectional area of conductive filament in a body of threshold switching material to a predetermined tolerable limit, which may be 25 microns, 10 microns, or even 5 microns or less, while providing for a much greater length such as 5, 10, 20, 50 or more times the width. Secondly, they distribute the current paths over a relatively large surface area, thereby making it possible to employ substantial masses of highly thermally conductive material as heat sinks to help distribute the heat harmlessly away from the filamentary current paths in the switching material. Thirdly, they can be scaled up in size to handle high power transients. Finally, they provide redundant active sections, and redundant interconnections and electrodes to the various active sections of the device. Such redundancy allows the overvoltage protection apparatus to function even when one or more active sections of the device or its electrodes or interconnections have been open circuited by thermal stress. Thus, the apparatus can stand up well under repeated very high current, high speed transients such as might be generated by multiple lightning strikes or EMPs.

Figure 13:
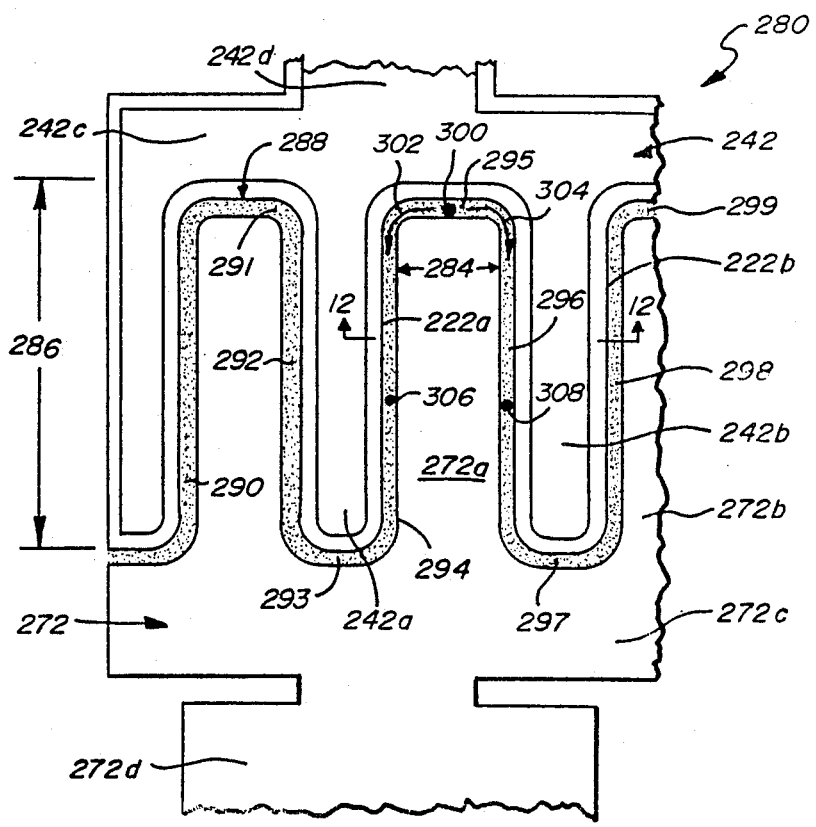
FIG. 13 is a partial plan view of an electrical device of the present invention having interdigitated electrodes.

In FIG. 13, a partial plan view of an electrical device 280 of the present invention having a nonhorizontal elongated current conduction path arranged between interdigitated electrodes is shown. The thin film structure 260 of FIG. 12 may be used to construct the electrical device 280. In particular a partial cross-section taken along line 12—12 of FIG. 13 would appear as shown in FIG. 12. The structure 280 has a top metallization layer patterned into an upper electrode 242 which has a plurality of finger-like sections, such as fingers 242a and 242b extending from a common connecting section 242c. Connected to common section 242c and extending in the direction opposite the fingers is section 242d which may lead to a connection means, such as a contact pad (not shown), for making an electrical connection to top electrode 242. The bottom electrode 272 similarly has finger-like sections 272a and 272b, which are in the channels between the patterned mesa structures of insulating layer 222, and a common base section 272c to which its fingers are interconnected and a contact pad section 272d (partially shown) for making electrical connections thereto. As shown in FIG. 13, the top electrode layer 242 is preferably formed above the patterned insulating layer 222, while the bottom patterned electrode layer 272 is preferably formed adjacent to and in between the channels such as channel 270 defined by the side walls of insulating layer 222.

The width of the channels such as width 284 of channel 270 between insulating mesa structures 222a and 222b, should be sized for effective heat dissipation, such as approximately 5 to 50 microns or more in width. As the channel width increases, the average amount of heat being dissipated per unit area of the electrical device decreases. The width of electrode layer 272 can also be increased correspondingly, thus increasing its ampacity so as to reduce resistance heating effects therein.

The electrical device 280 may also be constructed using the thin film structure 220 of FIG. 9. In such a case, the bottom electrode layer would not have separate fingers, as does layer 272 shown in FIG. 13, but would consist of a solid plane of material everywhere under the fingers of upper electrode layer 242. (Upper electrode 242 could even be left unpatterned, if desired, for minimum inductance and maximum current-carrying and heating dissipating capacity.) Although only several fingers of limited size are shown in FIG. 13, it will be appreciated that the length 286 and number of interdigitated fingers may be increased as desired, to increase current capacity of apparatus 280.

To use apparatus 280, one of the electrode layers 242 and 272 is connected to a conductor or electrical device to be protected, while the other of the electrode layers is connected to a discharge path such as DC common or ground to which current due to overvoltage applied on the other conductor can be harmlessly shunted to. The general location of the overall elongated current conduction path 288 of device 280 between the upper and lower electrodes 242 and 272 is indicated with stippling. The path 288 is made of contiguous transverse and longitudinal parts 289 through 299. In operation, overvoltage will be substantially instanteously applied everywhere between the upper and lower electrodes, thus preparing all of the threshold switching material 38 in the path 288 for being switched to its on-state. At least one point such as point 300 in part 295 (which is arbitrarily chosen for purposes of this example) will switch to its on-state, forming a current filament. The filament will thereafter very rapidly spread in directions 302 and 304 along the path 288 until the size of the elongated filaments corresponds to the maximum current produced by the overvoltage condition. For example, the elongated filament may only need to expand to points 306 and 308 of parts 294 and 296 of the path 288 to handle a certain amount of current. If the current is high enough, the filament may expand along the entire length of path 288. The speed of filament growth or propagation along path 288 is expected to be as fast as necessary to handle any transient overvoltage condition which is applied, and may well approach the speed of light.

The foregoing operation may be further understood by considering the FIG. 9 device. The filamentary conduction path 250a shown in FIG. 9 between thin film carbon layers 232' and 232a will grow along the perimeter of the mesa structure 226 as it expands to handle whatever currents are imposed by overvoltage conditions experienced by device 306. Similarly, filamentary conduction path 250b shown in FIG. 9 and associated with mesa structure 228 will expand as needed and substantially encircle the perimeter of its mesa structure if necessary. However, assuming that channel 230 has sufficient width, the filamentary path 250a will not expand directly across the channel to path 250b or vice versa.

Recent experiments we have done confirm that the size of the current filament in an Ovonic threshold switching device, once initiated, expands and contracts as required to maintain a current density of approximately $2 \times 10^4$ amps per square centimeter. Thus, when apparatus 280 operates, for example, we expect that for small currents induced by overvoltage conditions, there may be a current filament only in one or two of the individual parts of path 288, and that it may not even be necessary for this current filament to expand to fill the entire elongated current path of the device. However, for larger currents applied across apparatus 300, it is expected that current filaments will extend to (or form in) two or more parts of path 288, such as contiguous 294 through 296, and will include however many of the parts 289-299 of path 288 that are required to handle the current surge. The existence of a number of distinct interdigitated fingers provides a measure of redundancy for the apparatus 280. If one or more of the individual fingers or parts of the path 288 do not operate or have been open-circuited during a previous current surge, the remaining contiguously connected parts of the path 288 may well provide the necessary overvoltage protection.

The individual fingers and associated layers of device 280 are preferably formed simultaneously by successively depositing and patterning thin film layers as taught or shown in FIGS. 9 through 13. Accordingly, the individual parts 289 through 299 of path 288 should have virtually identical current-voltage characteristics. This is because each elongated surface portion of the upper and lower electrodes of each part of the path 288 adjacent to and in intimate electrical contact with the layer 38 of switching material will be physically spaced equidistantly along its length from and operatively disposed with respect to another of the elongated surface portions, thereby providing a highly uniform distance for current flow therebetween. In this respect, it is preferred as is shown in FIG. 13 to round the corners of current path 288 which respectively connect the transverse parts 289, 291, 293, 295 and 297 and horizontal parts 290, 292, 294, 296 and 298 thereof, in order to avoid high field effects associated with rectangular corners, which might well change the I-V characteristics there. Also, no appreciable additional cost is involved in forming any additional fingers, if greater ampacity is desired, since the thin films of material are all patterned simultaneously over the same large area of the substrate 262. Integrally forming multiple parts of a current conduction path such as path 288 with closely matched I-V characteristics helps ensure that the various parts of the path will relatively equally share in handling large transient currents, instead of having one part of the current path attempt to handle it all, and possibly be destroyed while doing so.

Figure 14:
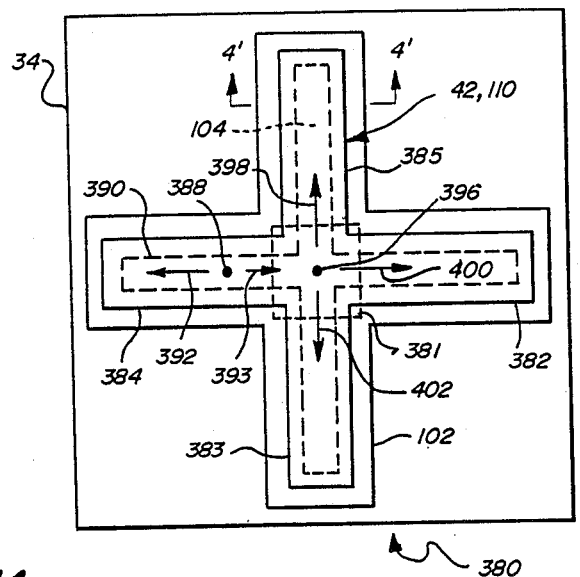
FIG. 14 is a plan view in another embodiment of the present invention illustrating bifurcation of an expanding current filament.

In FIG. 14, there is shown a plan view for yet another overvoltage protection device 380 of the present invention. Although this device may be implemented using a number of the structures shown in FIGS. 1 through 12, it will be explained as though it is constructed using the structure 118 of FIG. 4B. Device 380 may include a large rectangular, planar bottom electrode 34 as shown in FIG. 14 and a top electrode formed of electrode layer 42 and top metallization layer 110 patterned in the form of a cross as shown. The top electrode includes a central node section 381 indicated by dashed lines and four leg sections 382 through 385 which each extend radially outwardly from the common central node section 382 as shown. A cross-section of leg section 385 taken along lines 4'—4' in FIG. 16 would appear similar to structure 118 shown in FIG. 4B, including having a channel 104 formed by an elongated opening 104 in the insulating layer 102. The width 108 of the channel 104 in leg section 385 may be 2 to 25 microns, with 2 to 10 microns being preferred. The length of the individual leg sections 382 through 385 is preferably 10 times, and may be 20 to 100 times or more than the width of the channels such as channel 104 in leg section 385. The channel or current path of device 380 is shown in dashed line extending across through the central node section and under the leg sections 382 through 384, and forms a smaller cross-like pattern.

In operation device 380 may, for example, begin to conduct at point or location 388 in channel 390 of leg section 384 when a relatively small overvoltage condition is applied to the device. As the current increases, the current filament will expand in all directions filling the width of the channel 390 of threshold switching material beneath leg section 384, quickly contacting the side walls of the channel adjacent either side of location 388 and continuing to expand longitudinally along the channel as indicated by arrows 392 and 393. When the expanding current filament reaches point or location 396, it has the opportunity to continue to expand in three orthogonal directions indicated by arrows 398, 400 and 402. Thus, the expanding current filament is bifurcated or split into the channels filled with threshold switching material below leg sections 382, 383 and 385. The expansion of the current filament into these separate channels allows the current to be distributed over a much larger area than would be possible if the threshold device simply consisted of a large pancake of threshold switching material disposed between two large pancake electrodes on either side thereof. Thus, concentration of localized heating effects, which are expected to impose a fundamental limitation on the maximum effective size of the pancake design, are substantially or completely avoided by the structure 380.

Figure 15:
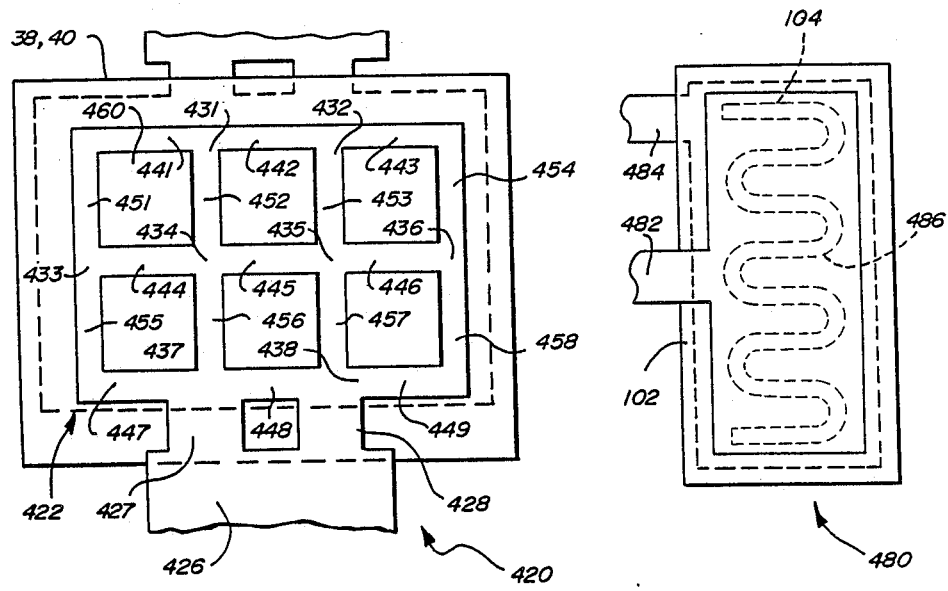
FIG. 15 is a plan view of another embodiment of the present invention having redundant electrode interconnections.

Referring now to FIG. 15, an overvoltage protection apparatus 420 is shown in plan view therein. The apparatus 420 includes an upper electrode layer 422 and a continuous planar bottom electrode layer 424, both patterned as shown. The top electrode 422 is provided with a contact pad section 426 and redundant interconnecting traces 427 and 428 leading from contact pad 426 to the main portion of the patterned layer 422. The top metal layer 422 includes central node sections 431 through 438 which have leg sections extending outwardly therefrom at least three orthogonal directions. The leg sections include horizontal leg sections 441 through 449 and vertical leg sections 451 through 458. Together the central node section 431 through 438 and the leg sections 441 through 458 form a rectangularly arranged, highly conductive grid of plural horizontal lines and plural vertical lines intersecting one another for distributing current due to overvoltage conditions over a fairly wide area. This interconnected grid provides redundant conductive paths in top electrode layer 422 to reach any particular point of conduction thereunderneath.

The apparatus 420 shown in FIG. 15 can be implemented using a number of the structures in FIGS. 1 through 12. For example, the FIG. 1 structure may be used with the bottom electrode layer 34 in FIG. 1 serving as the bottom electrode 424 in the FIG. 17 apparatus, and the top electrode layer 42 in FIG. 1 being patterned so as to form the top electrode layer 422 shown in FIG. 17. In such an embodiment, the layer 38 of threshold switching material would not need to be patterned in the vicinity of the various parts of the current path, although it could be if desired. The same is true for the upper layer 40 of thin film carbon material, since due to its thinness, it would have relatively high resistivity or could readily be made so by adjusting selected deposition process parameters. Even when layers 38 and 40 are continuous (i.e., not patterned) as shown, the width of the elongated current conduction path beneath the leg and node sections of patterned layer 422 will be substantially confined to the area directly under the leg and node sections due to a voltage and/or current a micron or several microns away from the edges of the patterned areas of the upper electrode that is insufficient to sustain the conduction process required for lower resistance in any threshold switching material. One benefit of not patterning upper carbon layer 40 is that it provides a barrier to help prevent contamination of layer 38 by subsequent processing steps, until a passivating layer is placed thereover.

For more efficient distribution of current (as well as any heat generated during operation of the device), it is preferred to also provide a layer of relatively thick aluminum over the electrode layer 422 which may be patterned if desired like layer 422.

By properly sizing the widths and lengths of the leg sections of the apparatus 420, concentration of localized heating effects can be substantially avoided or eliminated. It is preferred to have the length of the leg sections in the FIG. 15 embodiment be at least 5 times and preferably 10 or 20 times or more that of the width of the leg sections. Thus, for example, if the leg sections were 10 microns wide, the rectangular area 460 in the upper lefthand corner of FIG. 17 enclosed by leg sections 441, 444, 451 and 452 would be 100 microns by 100 microns or 200 microns by 200 microns or more.

Figure 16:
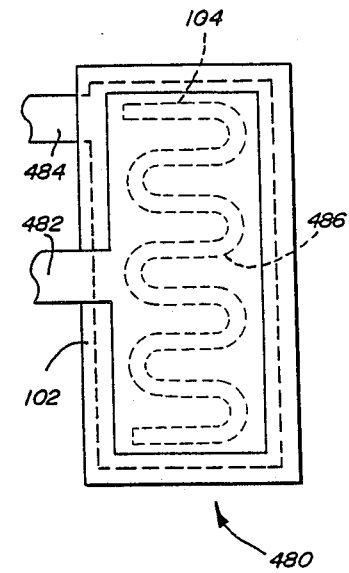
FIG. 16 is a plan view of an electrical device of the present invention having a serpentine current conduction channel.

In FIG. 16 there is shown one more embodiment of an overvoltage protection device of the present invention. The device 480 therein has a top metallization layer patterned into a generally rectangular electrode 482, a bottom electrode 484, and a serpentine conduction channel 486 of threshold switching material disposed therebetween. The device 480 may be implemented using a number of the structures shown in cross-section in FIGS. 1 through 12. For example, the FIG. 4A device could be used to implement device 480 by simply patterning the insulating layer 102 so that opening 102 forms a serpentine shaped channel 486 as shown in dotted lines in FIG. 16. As with the other embodiments, the FIG. 16 device beneficially limits the current conduction or the threshold material to the area under the patterned electrode layer 482, thus preventing deleterious localized heating effects when the device is placed in operation.

The variety of configurations available for the overvoltage protection devices of the present invention, coupled with their small size and generally planar construction, allows the devices to be tailored to have a preselected impedance by controlling resistance, capacitance and inductance. If desired, capacitance and/or inductance can be minimized as pointed out with respect to a number of the illustrated embodiments. Thus, the devices of the present invention when appropriately scaled in size are particularly well suited for use in connection with microelectronic circuit applications, where large capacitances are to be avoided. Similarly, the devices of the present invention are very well suited for extremely high speed operation, on account of their very low inductance values. In this regard, it is preferred to make electrical connections to the devices of the present invention with a minimum number of turns or angles so as to not unnecessarily increase the apparent inductance of the overvoltage protection device.

The foregoing discussion of the various preferred embodiments of the present invention have all included two layers of thin film carbon as barrier layers between the threshold switching material and the more conductive electrode layers, such as electrode layers 34 and 42 in FIG. 1. The use of such thin film carbon layers is preferred when a overvoltage protection device having long-term highly stable device characteristics is desired. In particular the thin film carbon layers are believed to provide a superior barrier layer for direct current applications of thin film threshold switching devices using amorphous chalcogenide switching material of the type invented by S. R. Ovshinsky. However, it is well known that overvoltage protection devices made with such threshold switching material but without such barrier layers of thin film carbon, work quite satisfactorily especially for alternating current applications. Accordingly, it is to be appreciated that all of the overvoltage protection devices and apparatus of the present invention may be made without such thin film carbon layers. In such embodiments the electrode layers, such as layers 34 and 42 in FIG. 1, would directly contact the threshold switching material.

Although the amorphous chalcogenide threshold switching materials are preferred for use in the embodiments of the present invention, any other suitable threshold switching material may be used, provided it can be suitably deposited or otherwise incorporated into the devices of the present invention.

Substantially amorphous molybdenum has been disclosed above as a preferred material for making the intermediate electrode layers, such as electrode layers 34 and 42 in FIG. 1 of the illustrated threshold switching devices. Any number of other conductive materials may be utilized, provided they are compatible with the threshold switching material and other materials being used in the device. For example, overvoltage protection devices made with amorphous chalcogenide threshold switching materials may also utilize electrode layers made of tantalum, graphite, niobium, refractory metal oxides, carbides and sulphides. Preferably, such materials are deposited using vacuum techniques in a substantially disordered generally amorphous condition so that there is no tendency for the amorphous chalcogenide semiconductor material to assume a crystalline-like state from being in contact with such electrodes.

In each embodiment of the present invention shown in the Figures, a passivating layer of any suitable insulating material may be and is preferably deposited over the structure to provide for protection against environmental contamination and/or unintended electrical contact with other devices or circuits. It is preferred to use a a material for this passivating layer which has a good thermal conductivity so that a heat sink may be placed in intimate physical contact therewith to provide additional heat dissipating capability. A disk or thin sheet of aluminum or silver or suitable silicon-based liquid or synthetic oil material could be used as the heat sink for example. These and other suitable heat sink designs are well known to those in the art of designing transient overvoltage protection devices, and thus need not be described further here.

Each overvoltage apparatus of the present invention may be deposited directly on top of an existing microelectronic circuit and connected thereto so as to provide overvoltage protection to a conductor or a circuit thereon. The thin film devices of the present invention can be manufactured simultaneously by the dozens or thousands of units on top of a single integrated circuit (IC) chip or crystalline wafer containing many such chips. Thus, the devices of the present invention can be economically made an integral part of IC chips by the chip manufacturer. Alternatively, several dozens or hundreds or more devices of the present invention can be simultaneously mass-produced on a single large area (e.g., 100 to 1000 cm$^2$) substrate, such as thin sheets of stainless steel with (or without) a thin layer of insulating material, synthetic plastic web materials, or glass, using batch processing techniques for making integrated solid-state devices. The substrate may be subsequently diced into groups of devices or individual devices and one or more for packaging in conventional fashion in cannisters or chip carriers, so they may be sold as discrete devices for use in the electronic industry. Such packages may also be provided with conventional heat sinks to improve the ability of the package devices to dissipate heat. Special packages could also be designed to allow such devices to be readily incorporated into electrical connectors and the like, as taught in aforementioned U.S. patent application Ser. No. 666,582.

Having thus described several preferred embodiments of the present invention, it is recognized that those skilled in the art may make various modifications or additions to the preferred embodiments chosen to illustrate the present invention without departing from the spirit and the scope of the present contribution to the art. For example, one or more of the structures of the present invention may be incorporated into all thin film electronic arrays or in hybrid crystalline/thin film electronic arrays to protect solid-state circuit components therein. In such instances, thin film electrode layer 34 may be placed on top of or replaced by a bottom electrode-forming layer which also forms part of a diode, isolation device, or other addressing means constructed on or in the thin film structure or crystalline structure below. The "electrode" or "electrode layer" as used in the claims below is meant to include such electrode-forming layers. Therefore, it is to be understood that within the scope of the appended claims the inventions can be practiced otherwise than have specifically been described above.

We claim:

1. A solid-state overvoltage protection apparatus of the type having a plurality of spaced electrodes and a body of threshold switching material disposed therebetween, said body having a high electrical resistance to provide a blocking condition for substantially blocking current therethrough at operating voltages below a first nominal voltage level and a lower electrical resistance at overvoltages above said nominal voltage level to provide a conducting condition for conducting current therethrough, the improvement comprising in combination:

means for providing an elongated current conduction path of substantially uniform distance between said electrodes through said body confined to an elongated cross-sectional area of said body transverse to the direction of current flow, said cross-sectional area having an effective length along the major dimension of said area which is at least about ten times greater than the maximum effective width of said area, whereby relatively large currents associated with overvoltages which may flow therethrough are distributable over said elongated area.

2. An apparatus as in claim 1 wherein said plurality of electrodes each has an elongated surface portion adjacent to and in intimate electrical contact with said body, wherein one of said elongated surface portions is physically spaced equidistantly along its length from and operatively disposed with respect to another of said elongated surface portions, thereby providing said elongated current conduction path of substantially uniform distance between said two associated elongated surface portions.

3. An apparatus as in claim 2 wherein said two associated elongated surface portions are generally non-coplanar.

4. An apparatus as in claim 1 further including a highly thermally conductive substrate disposed below said threshold switching material.

5. An apparatus as in claim 1 wherein said substrate has an insulating surface, thereby substantially preventing current flow between said electrode layers and said substrate.

6. An apparatus as in claim 4 wherein said substrate is formed from a conductive metal.

7. An apparatus as in claim 3 wherein said substrate is substantially formed from an insulating material selected from the group consisting of deposited diamond, quartz, sapphire, and single-crystal-semiconductor material.

8. An apparatus as in claim 1 wherein said threshold switching material is a substantially amorphous semiconductor material.

9. An apparatus as in claim 8 wherein said amorphous semiconductor material includes at least one chalcogenide element.

10. An apparatus as in claim 1 wherein said threshold switching material has a threshold voltage value substantially equal to said first voltage level, and wherein said high electrical resistance in response to a voltage substantially above said threshold voltage value very rapidly decreases in at least one portion of said path to said lower electrical resistance which is orders of a magnitude lower than said high electrical resistance to provide said conducting condition.

11. An apparatus as in claim 1 wherein said plurality of electrodes each include a film of electrically conductive, non-single-crystal, phase-stable, non-switching carbon material in intimate electrical contact with said body.

12. An apparatus as in claim 1 wherein said electrodes each include a thin film refractory material.

13. An apparatus as in claim 12 wherein said refractory material is in direct contact with threshold switching material.

14. An apparatus as in claim 1 wherein said threshold switching material and said plurality of electrodes are formed from vacuum deposited thin film materials.

15. An apparatus as in claim 14 wherein said thin film materials are arranged in layers stacked one on top of the other such that when said current conduction path is formed in said apparatus between said plurality of electrodes said path extends substantially vertically through said threshold switching material.

16. An apparatus as in claim 14 wherein said electrodes are spaced substantially horizontally apart from one another, and that at least a portion of said threshold switching material extends generally between said layers such that when said current conduction path is formed, it extends substantially horizontally through said material.

17. An apparatus as in claim 14 wherein one of said electrodes includes a non-insulated part; a first part of another of said electrodes is disposed above and horizontally displaced with respect to the nearest non-insulated part of said one of said electrodes and said threshold switching material is disposed therebetween such that when said current conduction path forms in said apparatus, it extends substantially diagonally through said threshold switching material between said parts of said layers.

18. An apparatus as in claim 14 wherein at least one of said electrodes and said threshold switching material have been patterned to form a mesa structure.

19. An apparatus as in claim 1, further comprising:
a layer of insulating material having an elongated opening therein in which at least a portion of said threshold switching material extends, and wherein one of said electrodes is disposed substantially in said opening, and
another of said electrodes is disposed above said portion of said threshold switching material in said opening,
such that when said current conduction path is formed in said apparatus, it extends substantially vertically between said electrode portions through said portion of said threshold switching material disposed in said opening.

20. An apparatus as in claim 19 wherein said opening defines said maximum effective width and limits said width to less than about five microns.

21. An apparatus as in claim 1 wherein said elongated current conduction path is serpentine.

22. An apparatus as in claim 1 wherein at least one of said electrodes is patterned to have a plurality of electrically interconnected sections spaced apart from one another at predetermined angles.

23. An apparatus as in claim 22 wherein said one patterned electrode includes at least three leg sections interconnected at a common central node section with each such leg section extending outwardly therefrom in a direction different from the other two leg sections.

24. An apparatus as in claim 23 wherein said patterned layer includes a plurality of common node sections interconnected by at least one of said leg sections.

25. An apparatus as in claim 24 having at least four common node sections, with each such common node sections being electrically and physically interconnected to two leg sections which each lead to another distinct common node section, thereby Providing redundant electrical paths to each common node sections.

26. An apparatus as in claim 22 wherein said plurality of leg sections each is associated with its own elongated current conduction path through said body of threshold switching material which is confined to a distinct elongated cross-sectional area of said body thereunderneath transverse to the direction of current flow therethrough, each of said cross-sectional areas having an effective length along its major dimension which is at least about ten times greater than its maximum effective width.

* * * * *